(12) United States Patent
Dairiki et al.

(10) Patent No.: US 8,487,306 B2
(45) Date of Patent: Jul. 16, 2013

(54) PHOTOELECTRIC CONVERSION ELEMENT, DISPLAY DEVICE, ELECTRONIC DEVICE, AND METHOD FOR MANUFACTURING PHOTOELECTRIC CONVERSION ELEMENT

(75) Inventors: Koji Dairiki, Kanagawa (JP); Hidekazu Miyairi, Kanagawa (JP); Tsudoi Nagi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 60 days.

(21) Appl. No.: 13/163,166

(22) Filed: Jun. 17, 2011

(65) Prior Publication Data

US 2011/0309361 A1     Dec. 22, 2011

(30) Foreign Application Priority Data

Jun. 18, 2010   (JP) .................................. 2010-139737

(51) Int. Cl.
*H01L 31/068*     (2012.01)
(52) U.S. Cl.
USPC ............................................. 257/53; 257/43
(58) Field of Classification Search
USPC ........ 257/43, 53, E29.076, E31.126, E31.047
See application file for complete search history.

(56) References Cited

U.S. PATENT DOCUMENTS

| 2008/0074401 A1 | 3/2008 | Chung et al. | |
| 2008/0252618 A1 | 10/2008 | Chung et al. | |
| 2009/0047758 A1* | 2/2009 | Yamazaki et al. | 438/158 |
| 2011/0278582 A1 | 11/2011 | Tezuka et al. | |

FOREIGN PATENT DOCUMENTS

| JP | 11-95263 | 4/1999 |
| JP | 2009-86565 | 4/2009 |

OTHER PUBLICATIONS

Lee, C.-H. et al., "Postdeposition Thermal Annealing and Material Stability of 75° C Hydrogenated Nanocrystalline Silicon Plasma-Enhance Chemical Vapor Deposition Films," Journal of Applied Physics, vol. 98, No. 3, Aug. 4, 2005, pp. 034305-1-034305-7.
Esmaeili-Rad, M.R. et al., "Absence of Defect State Creation in Nanocrystalline Silicon Thin-Film Transistors Deduced from Constant Current Stress Measurements," Applied Physics Letters, vol. 91, No. 11, Sep. 12, 2007, pp. 113511-1-113511-3.
Lee, C.-H. et al., "High-Mobility N-Channel and P-Channel Nanocrystalline Silicon Thin-Film Transistors," IEDM 05: Technical Digest of International Electron Devices Meeting, 2005, pp. 937-940.

(Continued)

*Primary Examiner* — Tran Tran
(74) *Attorney, Agent, or Firm* — Husch Blackwell LLP

(57) ABSTRACT

A photoelectric conversion element includes a first conductive layer over a substrate; a first insulating layer covering the first conductive layer; a first semiconductor layer over the first insulating layer; a second conductive layer formed over the first semiconductor layer; an impurity semiconductor layer over the second semiconductor layer; a second conductive layer over the impurity semiconductor layer; a second insulating layer covering the first semiconductor layer and the second conductive layer; and a light-transmitting third conductive layer over the second insulating layer. A first opening and a second opening are formed in the second insulating layer. In the first opening, the first semiconductor layer is connected to the third conductive layer. In the second opening, the first conductive layer is connected to the third conductive layer. In the first opening, a light-receiving portion surrounded by an electrode formed of the second conductive layer is provided.

19 Claims, 16 Drawing Sheets

OTHER PUBLICATIONS

Lee, C.-H. et al., "High-Mobility Nanocrystalline Silicon Thin-Film Transistors Fabricated by Plasma-Enhanced Chemical Vapor Deposition," Applied Physics Letters, vol. 86, May 24, 2005, pp. 222106-1-222106-3.

Sazonov, A. et al., "Low-Temperature Materials and Thin Film Transistors for Flexible Electronics," Proceedings of the IEEE, vol. 93, No. 8, Aug. 1, 2005, pp. 1420-1428.

Lee, C.-H. et al., "Postdeposition Thermal Annealing and Material Stability of 75° C Hydrogenated Nanocrystalline Silicon Plasma-Enhance Chemical Vapor Deposition Films ," Journal of Applied Physics, vol. 98, Aug. 4, 2005, pp. 034305-1-0343.

Esmaeili-Rad, M.R. et al., "High Stability, Low Leakage Nanocrystalline Silicon Bottom Gate Thin Film Transistors for AMOLED Displays," IEEE: IEDM, 2006, pp. 303-306.

Lee, C.-H. et al., "How to Achieve High Mobility Thin Film Transistors by Direct Deposition of Silicon Using 13.56 MHz RF PECVD?," IEDM, 2006, pp. 295-298.

Lee, C.-H. et al., "Directly Deposited Nanocrystalline Silicon Thin-Film Transistors with Ultra High Mobilities," Applied Physics Letters, vol. 89, No. 25, Dec. 18, 2006, pp. 252101-1-252101-3.

Lee, C.-H. et al., "Stability of nc-Si:H TFTs with Silicon Nitride Gate Dielectric," IEEE Transactions on Electron Devices, vol. 54, No. 1, 2007, pp. 45-51.

Arai, T. et al., "41.2: Micro Silicon Technology for Active Matrix OLED Display," SID Digest '07: SID International Symposium Digest of Technical Papers, vol. 38, 2007, pp. 1370-1373.

Esmaeili-Rad, M.R. et al., "Absence of Defect State Creation in Nanocrystalline Silicon Thin-Film Transistors Deduced from Constant Current Stress Measurements," Applied Physics Letters, vol. 91, Sep. 12, 2007, pp. 113511-1-113511-3.

Lee, H.J. et al., "Leakage Current Mechanisms in Top-Gate Nanocrystalline Silicon Thin-Film Transistors," Applied Physics Letters, vol. 92, Feb. 28, 2008, pp. 083509-1-083509-3.

Esmaeili-Rad, M.R. et al., "Absence of Defect State Creation in Nanocrystalline Silicon Thin-Film Transistors Deduced from Constant Current Stress Measurements," Applied Physics Letters, vol. 91, No. 11, Sep. 12, 2007, pp. 113511-1-113511-3.

* cited by examiner

PHOTOELECTRIC CONVERSION ELEMENT, DISPLAY DEVICE, ELECTRONIC DEVICE, AND METHOD FOR MANUFACTURING PHOTOELECTRIC CONVERSION ELEMENT

BACKGROUND OF THE INVENTION

1. Field of the Invention

The present invention relates to photoelectric conversion elements, display devices including the photoelectric conversion elements, and electronic devices. Further, the present invention relates to manufacturing methods thereof.

2. Description of the Related Art

In recent years, techniques relating to flat panel displays (in particular, liquid crystal display devices and light-emitting display devices (including EL display devices)) have been remarkably progressed. In the case of a flat panel display, providing a photoelectric conversion element over a substrate over which a pixel transistor is provided has been examined (for example, see Patent Document 1).

REFERENCE

[Patent Document 1] Japanese Published Patent Application No. H11-095263

SUMMARY OF THE INVENTION

Expected to be placed in a variety of locations in the future, flat panel displays need to have durability under severe usage environment, for example, in the case of being used outdoors. Further, it is anticipated that non-touchscreen display devices would also include photoelectric conversion elements as sensors that determine usage environment. Note that even such a photoelectric conversion element is provided over a substrate different from a substrate over which a pixel transistor of a display device is provided, in many cases. Even in the case where a photoelectric conversion element is provided over the same substrate as a pixel transistor, the photoelectric conversion element is manufactured through a process different from that of the pixel transistor in many cases.

In view of the above, an object of one embodiment of the present invention is to provide a photoelectric conversion element which has high durability and is provided over the same substrate as a pixel transistor. Another object of one embodiment of the present invention is to provide a method for manufacturing a photoelectric conversion element which can be manufactured through a manufacturing process not significantly different from that of a pixel transistor.

One embodiment of the present invention is a Schottky diode-type photoelectric conversion element which has a structure similar to that of a transistor including a semiconductor layer including a channel formation region and which is provided with a light-receiving portion where a light-transmitting conductive layer is formed over an exposed portion of the semiconductor layer.

Another embodiment of the present invention is a display device provided with, over one substrate, a transistor including a semiconductor layer including a channel formation region and a photoelectric conversion element which has a structure similar to that of the transistor and is provided with a light-receiving portion where a light-transmitting conductive layer is formed over an exposed portion of the semiconductor layer.

Another embodiment of the present invention is an electronic device including the display device for a display portion.

Another embodiment of the present invention is a method for manufacturing the photoelectric conversion element. The method for manufacturing the photoelectric conversion element is similar to a method for manufacturing a pixel transistor of a display device. A difference between these methods is that an opening is formed in a portion of an insulating layer, which overlaps with a semiconductor layer, to expose the semiconductor layer.

By applying one embodiment of the present invention to a photoelectric conversion element, the photoelectric conversion element can have high durability and can be provided over the same substrate as a transistor.

Further, by applying one embodiment of the present invention to a display device, the display device can be provided with, over one substrate, a pixel transistor and a photoelectric conversion element having high durability.

Further, by applying one embodiment of the present invention to an electronic device, the electronic device can be provided with, over one substrate, a pixel transistor of a display portion and a photoelectric conversion element having high durability.

By applying one embodiment of the present invention to a method for manufacturing a photoelectric conversion element, a photoelectric conversion element can be manufactured over the same substrate as a pixel transistor, through a manufacturing process which is not significantly different from that of the pixel transistor.

DETAILED DESCRIPTION OF THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Thus, the present invention should not be construed as being limited to the description of the embodiments below.

Note that in the following description, regions indicated by the same hatching pattern in drawings are basically the same layer.

Embodiment 1

In this embodiment, a photoelectric conversion element according to one embodiment of the present invention will be described.

Figure 1A:
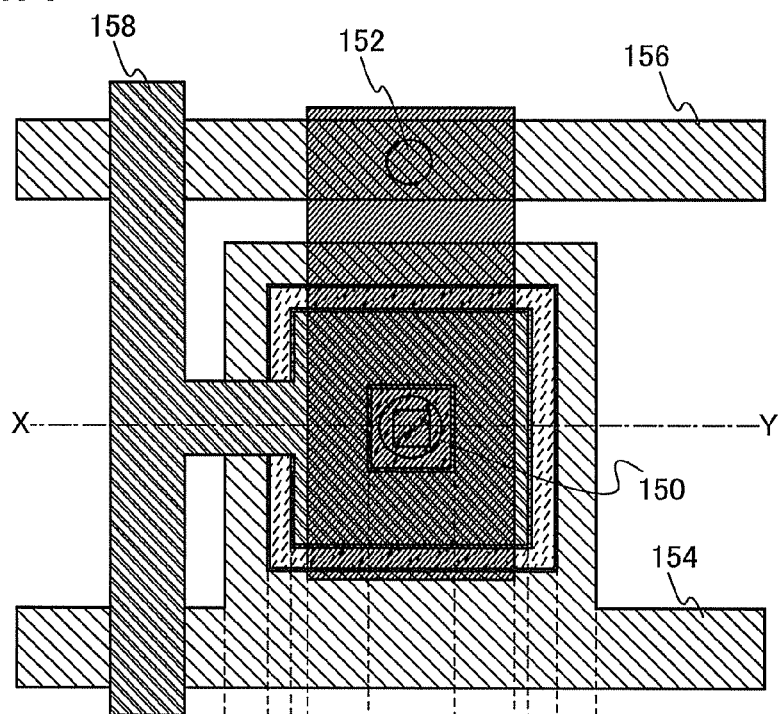
FIGS. 1A and 1B illustrate a photoelectric conversion element according to one embodiment of the present invention.
Figure 1B:
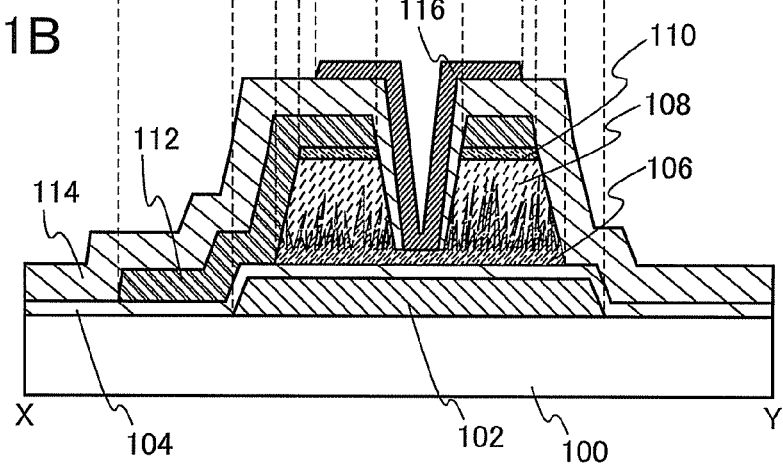

FIGS. 1A and 1B illustrate a photoelectric conversion element according to one embodiment of the present invention. The photoelectric conversion element in FIGS. 1A and 1B includes a first conductive layer 102 provided over a substrate 100; a first insulating layer 104 provided so as to cover the first conductive layer 102; a first semiconductor layer 106 provided over the first insulating layer 104; second conductive layer 108 provided over the first semiconductor layer 106 and apart from each other; an impurity semiconductor layer 110 provided over the second semiconductor layer 108; a second conductive layer 112 provided over the impurity semiconductor layer 110; a second insulating layer 114 provided so as to cover at least the first semiconductor layer 106 and the second conductive layer 112; and a third conductive layer 116 provided over the second insulating layer 114. The second insulating layer 114 has a first opening 150 and a second opening 152. The first opening 150 overlaps with a first wiring 154 formed of the first conductive layer 102, and the second opening 152 overlaps with a second wiring 156 formed of the first conductive layer 102. In the first opening 150, the first semiconductor layer 106 and the third conductive layer 116 are connected to each other, and in the second opening 152, the first conductive layer 102 and the third conductive layer 116 are connected to each other. The third conductive layer 116 including a light-transmitting conductive material is formed in the first opening 150, whereby a light-receiving portion is provided in the first opening 150. The light-receiving portion is surrounded rectangularly by the second conductive layer 112. Note that a third wiring 158 is formed of the second conductive layer 112.

Note that in the photoelectric conversion element seen in the top view of FIG. 1A, the light-receiving portion is surrounded rectangularly by a portion formed of the second conductive layer 112; however, one embodiment of the present invention is not limited thereto. The light-receiving portion may be surrounded circularly by the portion formed of the second conductive layer 112.

The first semiconductor layer 106 includes a semiconductor material having high carrier mobility (such as crystalline semiconductor typified by a microcrystalline semiconductor), and the second semiconductor layer 108 include a semiconductor material having carrier mobility lower than that the semiconductor material of the first semiconductor layer 106.

Here, operation of the photoelectric conversion element in FIGS. 1A and 1B will be described. In the photoelectric conversion element in FIGS. 1A and 1B, carriers (holes and electrons) are generated due to a photoelectric effect caused when the light-receiving portion formed in the first opening 150 receives light. Here, to the impurity semiconductor layer 110, an impurity element imparting n-type conductivity is added as an impurity element imparting one conductivity type.

The light-receiving portion formed in the first opening 150 is provided with a bottom electrode connected to the first wiring 154 formed of the first conductive layer 102 and a top electrode overlapping with the lower electrode and formed of the third conductive layer 116. Here, the potential $V_{bottom}$ of the bottom electrode may be either higher than or lower than the potential $V_{top}$ of the top electrode; however, $V_{bottom}$ is preferably higher than $V_{top}$. This is because dry etching is preferably performed to form the first opening 150, and the first semiconductor layer 106 in the light-receiving portion is damaged by plasma due to the thy etching, which inhibits the flow of the carriers. Note that this does not apply to the case where plasma damage is not caused in formation of the first opening 150.

Further, the potential of the top electrode $V_{top}$ is preferably lower than the potential $V_{line}$ of the third wiring 158 formed of the second conductive layer 112. This is to make electrons generated due to the photoelectric effect flow toward the third wiring 158 side.

In the case where the above relation is satisfied and $V_{bottom}$ is higher than $V_{top}$, electrons generated when light is received are attracted to the bottom electrode, whereas holes are attracted to the top electrode. Electrons excessively generated in the vicinity of the bottom electrode flow toward the third wiring 158 side, and holes attracted to the top electrode are recombined with some of electrons generated in the vicinity of the top electrode when light is received.

In the case where the above relation is satisfied and $V_{top}$ is higher than $V_{bottom}$, electrons generated when light is received are attracted to the top electrode, whereas holes are attracted to the bottom electrode. Holes excessively generated in the vicinity of the bottom electrode are recombined with some of electrons generated in the vicinity of the top electrode, and electrons in the vicinity of the top electrode flow toward the third wiring 158 side.

A photocurrent may be determined by detecting a change in the potential of the third wiring 158. For example, one electrode of a capacitor held at a certain potential may be electrically connected to the third wiring 158 to detect a change in the potential of the capacitor.

In a photoelectric conversion element according to one embodiment of the present invention, a light-receiving portion is not necessarily surrounded by the second conductive layer 112 when seen in the top view. FIGS. 2A and 2B, FIGS. 3A and 3B, and FIGS. 4A and 4B illustrate examples in each of which a light-receiving portion is not surrounded by the second conductive layer 112.

Figure 2A:
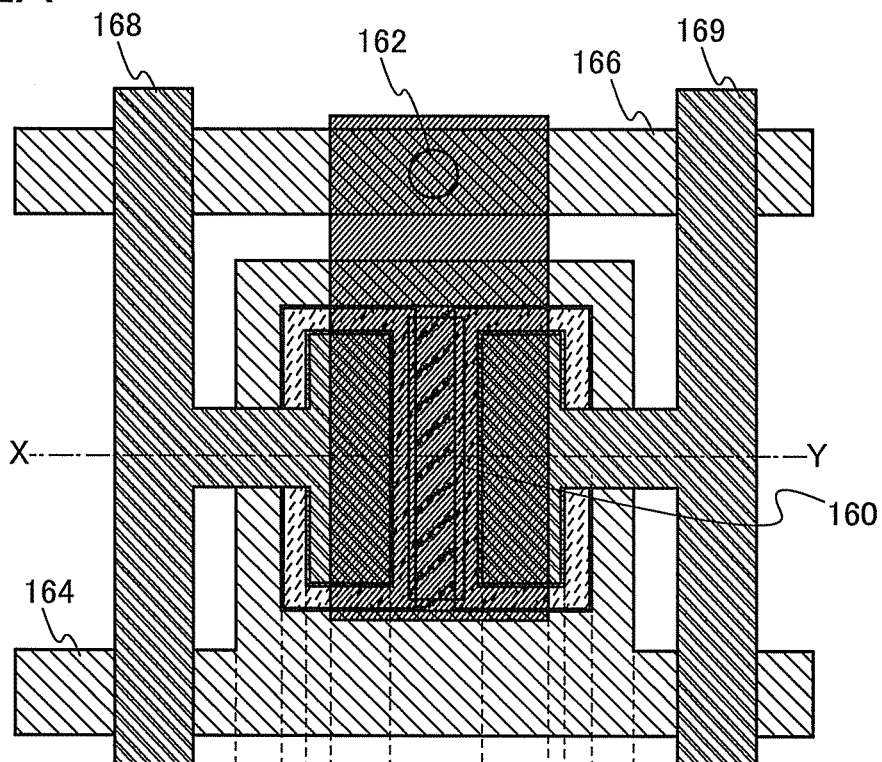
FIGS. 2A and 2B illustrate a photoelectric conversion element according to one embodiment of the present invention.
Figure 2B:
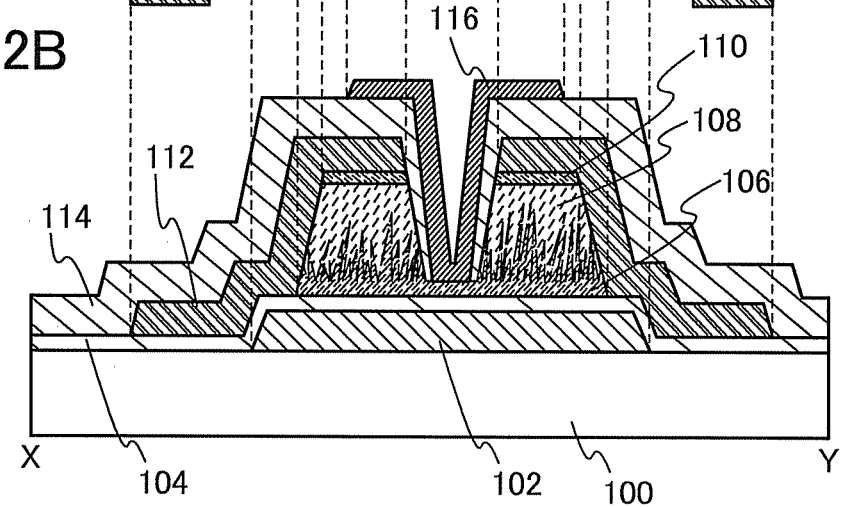

FIGS. 2A and 2B illustrate a photoelectric conversion element according to one embodiment of the present invention.

The photoelectric conversion element in FIGS. 2A and 2B has, over the substrate 100, a layered structure similar to that of the photoelectric conversion element in FIGS. 1A and 1B. The second insulating layer 114 has a first opening 160 and a second opening 162. The first opening 160 overlaps with a first wiring 164 formed of the first conductive layer 102, and the second opening 162 overlaps with a second wiring 166 formed of the first conductive layer 102. In the first opening 160, the first semiconductor layer 106 and the third conductive layer 116 are connected to each other, and in the second opening 162, the first conductive layer 102 and the third conductive layer 116 are connected to each other. The third conductive layer 116 including a light-transmitting conductive material is formed in the first opening 160, whereby a light-receiving portion is provided in the first opening 160. Note that a third wiring 168 and a fourth wiring 169 are formed of the second conductive layer 112, and the light-receiving portion is sandwiched between the third wiring 168 and the fourth wiring 169.

Figure 3A:
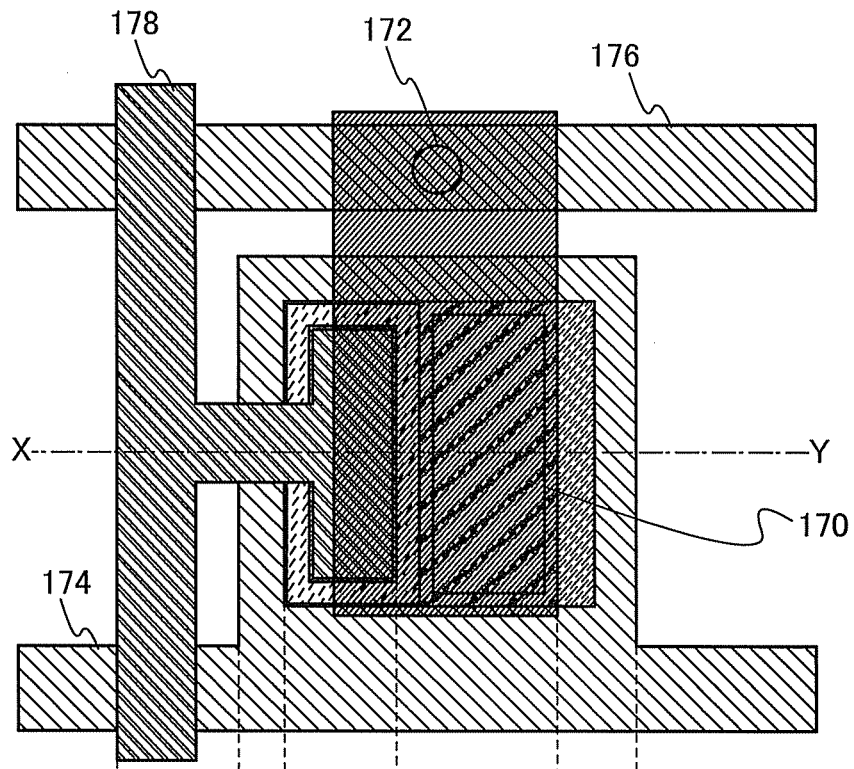
FIGS. 3A and 3B illustrate a photoelectric conversion element according to one embodiment of the present invention.
Figure 3B:
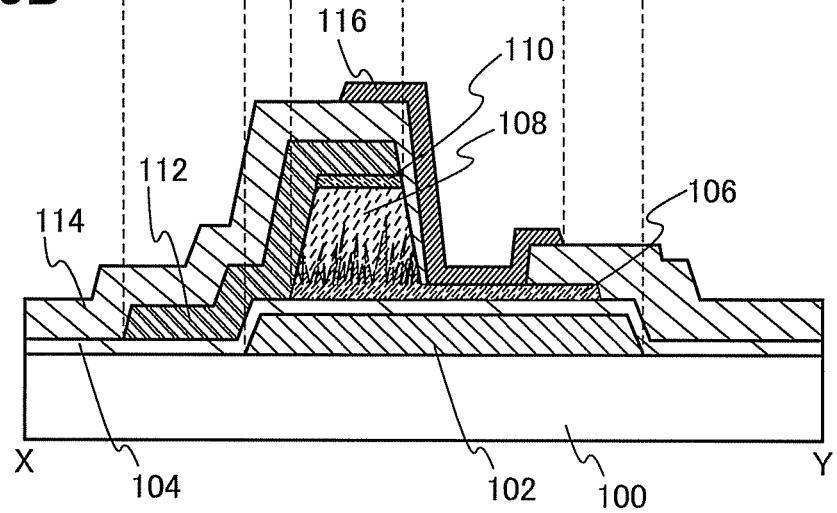

FIGS. 3A and 3B illustrate a photoelectric conversion element according to one embodiment of the present invention. The photoelectric conversion element in FIGS. 3A and 3B has, over the substrate 100, a layered structure similar to that of the photoelectric conversion element in FIGS. 1A and 1B. The second insulating layer 114 has a first opening 170 and a second opening 172. The first opening 170 overlaps with a first wiring 174 formed of the first conductive layer 102, and the second opening 172 overlaps with a second wiring 176 formed of the first conductive layer 102. In the first opening 170, the first semiconductor layer 106 and the third conductive layer 116 are connected to each other, and in the second opening 172, the first conductive layer 102 and the third conductive layer 116 are connected to each other. The third conductive layer 116 including a light-transmitting conductive material is formed in the first opening 170, whereby a light-receiving portion is provided in the first opening 170. Note that a third wiring 178 is formed of the second conductive layer 112. It can be said that the photoelectric conversion element in FIGS. 3A and 3B is not provided with the fourth wiring 169 in FIGS. 2A and 2B. Such a structure is preferable because the area of the light-receiving portion can be large.

Figure 4A:
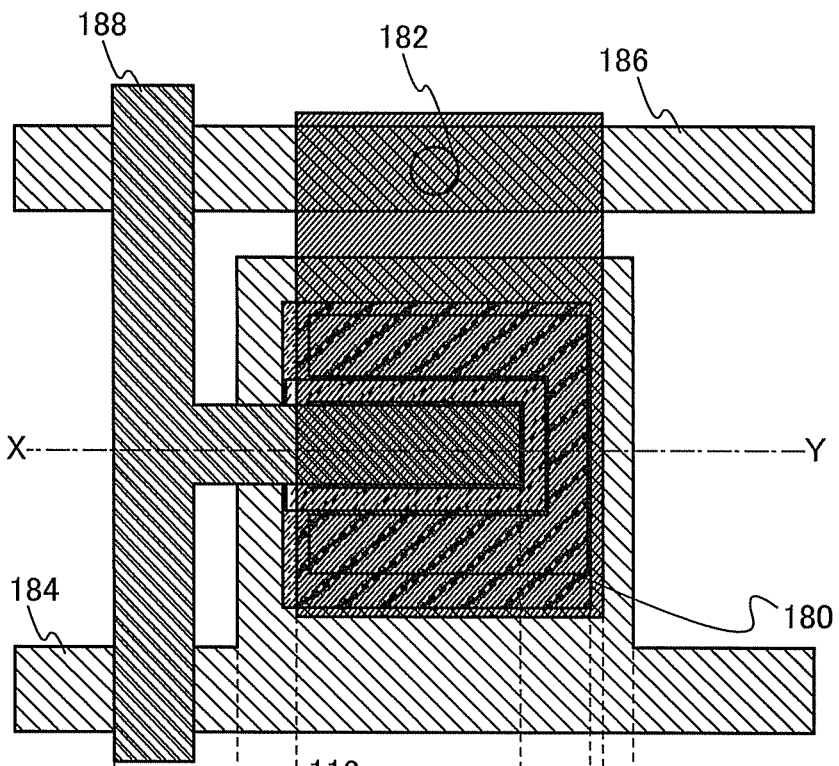
FIGS. 4A and 4B illustrate a photoelectric conversion element according to one embodiment of the present invention.
Figure 4B:
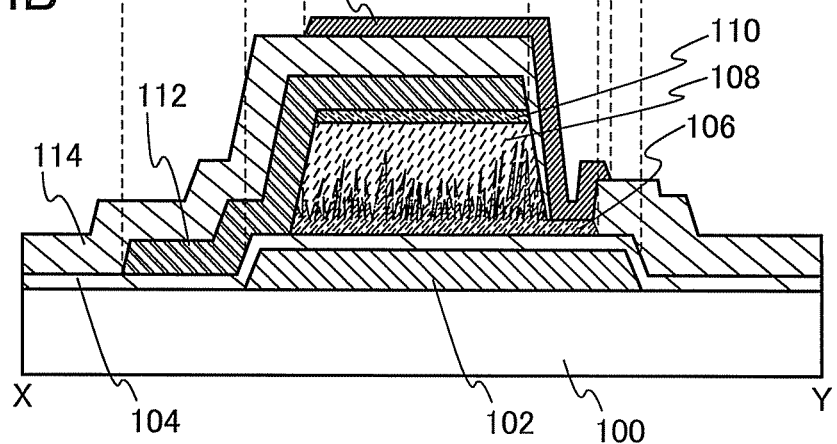

FIGS. 4A and 4B illustrate a photoelectric conversion element according to one embodiment of the present invention. The photoelectric conversion element in FIGS. 4A and 4B has, over the substrate 100, a layered structure similar to that of the photoelectric conversion element in FIGS. 1A and 1B. The second insulating layer 114 has a first opening 180 and a second opening 182. The first opening 180 overlaps with a first wiring 184 formed of the first conductive layer 102, and the second opening 182 overlaps with a second wiring 186 formed of the first conductive layer 102. In the first opening 180, the first semiconductor layer 106 and the third conductive layer 116 are connected to each other, and in the second opening 182, the first conductive layer 102 and the third conductive layer 116 are connected to each other. The third conductive layer 116 including a light-transmitting conductive material is formed in the first opening 180, whereby a light-receiving portion is provided in the first opening 180. Note that a third wiring 188 is formed of the second conductive layer 112. The first opening 180 is provided so that it partly surrounds an electrode formed of the second conductive layer 112 from three directions. Such a structure is preferable because the area of a surface of the electrode to which a photocurrent flows can be large.

In a photoelectric conversion element according to one embodiment of the present invention, one of wirings formed of the first conductive layer 102 in the above embodiment may be formed of the second conductive layer 112.

Figures 5A, 5B:
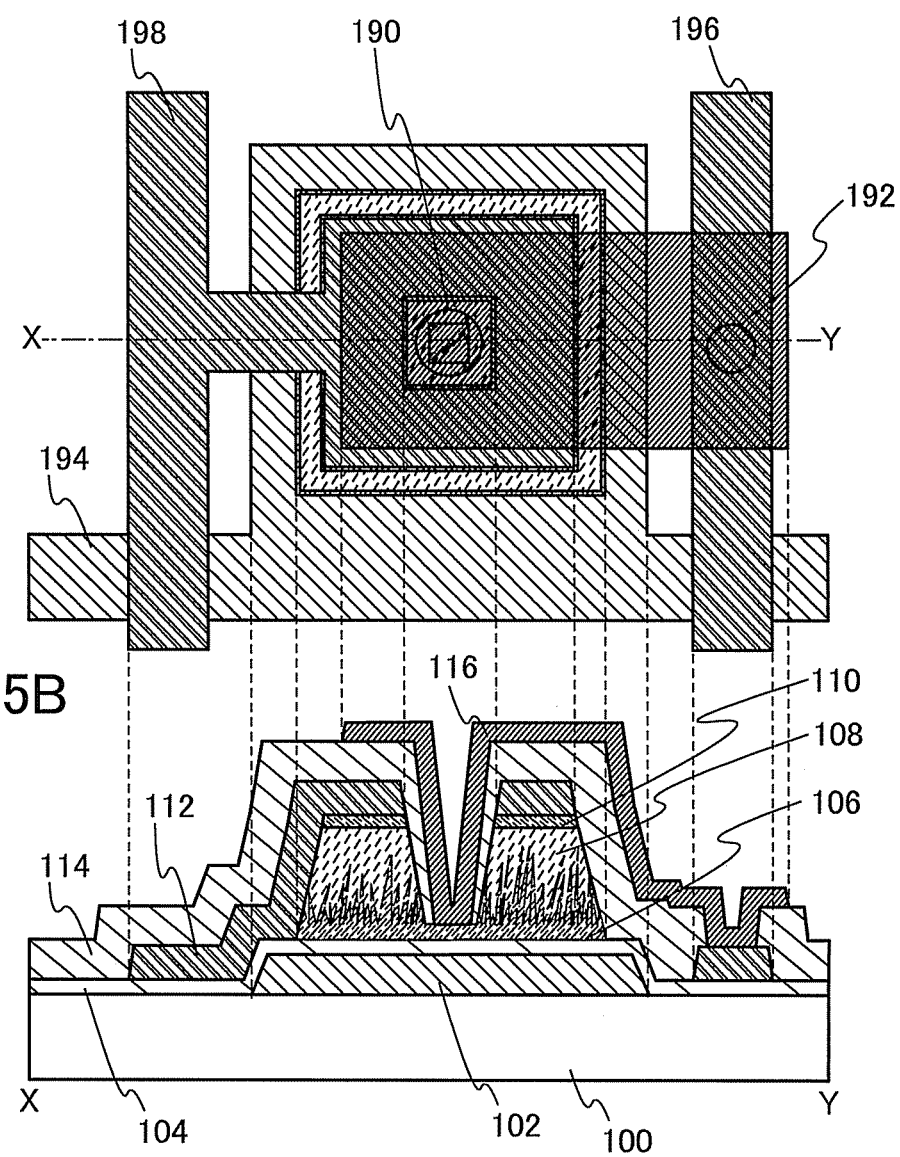
FIGS. 5A and 5B illustrate a photoelectric conversion element according to one embodiment of the present invention.

FIGS. 5A and 5B illustrate a photoelectric conversion element according to one embodiment of the present invention. The photoelectric conversion element in FIGS. 5A and 5B has, over the substrate 100, a layered structure similar to that of the photoelectric conversion element in FIGS. 1A and 1B. The second insulating layer 114 has a first opening 190 and a second opening 192. The first opening 190 overlaps with a first wiring 194 formed of the first conductive layer 102, and the second opening 192 overlaps with a second wiring 196 formed of the second conductive layer 112. In the first opening 190, the first semiconductor layer 106 and the third conductive layer 116 are connected to each other, and in the second opening 192, the second conductive layer 112 and the third conductive layer 116 are connected to each other. The third conductive layer 116 including a light-transmitting conductive material is formed in the first opening 190, whereby a light-receiving portion is provided in the first opening 190. The light-receiving portion is surrounded rectangularly by the second conductive layer 112. Note that a third wiring 198 is formed of the second conductive layer 112.

The structure in FIGS. 5A and 5B is effective particularly in the case where the conductivity of a conductive material of the first conductive layer 102 is lower than that of a conductive material of the second conductive layer 112.

Note that in FIGS. 1A and 1B to FIGS. 5A and 5B, wirings given different potentials are provided; however, one embodiment of the present invention is not limited thereto.

Figure 6A:
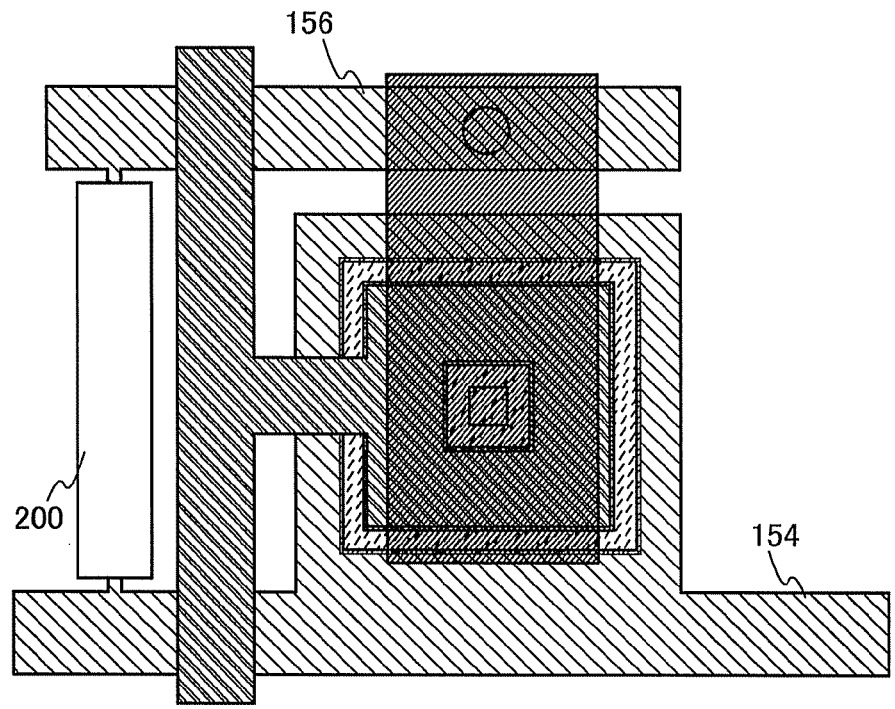
FIGS. 6A and 6B each illustrate a photoelectric conversion element according to one embodiment of the present invention.

For example, in FIGS. 1A and 1B, the second wiring 156 and the first wiring 154 are not necessarily independent wirings. A register 200 may be provided between the first wiring 154 and the second wiring 156 so that a potential difference is generated between the first wiring 154 and the second wiring 156 (FIG. 6A).

Here, when the resistance of the resistor 200 is $R_{200}$ and the current flowing to the resistor 200 is $I_{200}$, between the potential $V_H$ of a high-potential-side wiring (the first wiring 154) and the potential $V_L$ of a low-potential-side wiring (the second wiring 156), $V_H - V_L = I_{200} R_{200}$ is satisfied. Thus, by setting the resistance $R_{200}$ of the resistor 200 and the current $I_{200}$ flowing to the resistor 200 to be constant, a potential difference between the high-potential-side wiring (the first wiring 154) and the low-potential-side wiring (the second wiring 156) can be constant.

Figure 6B:
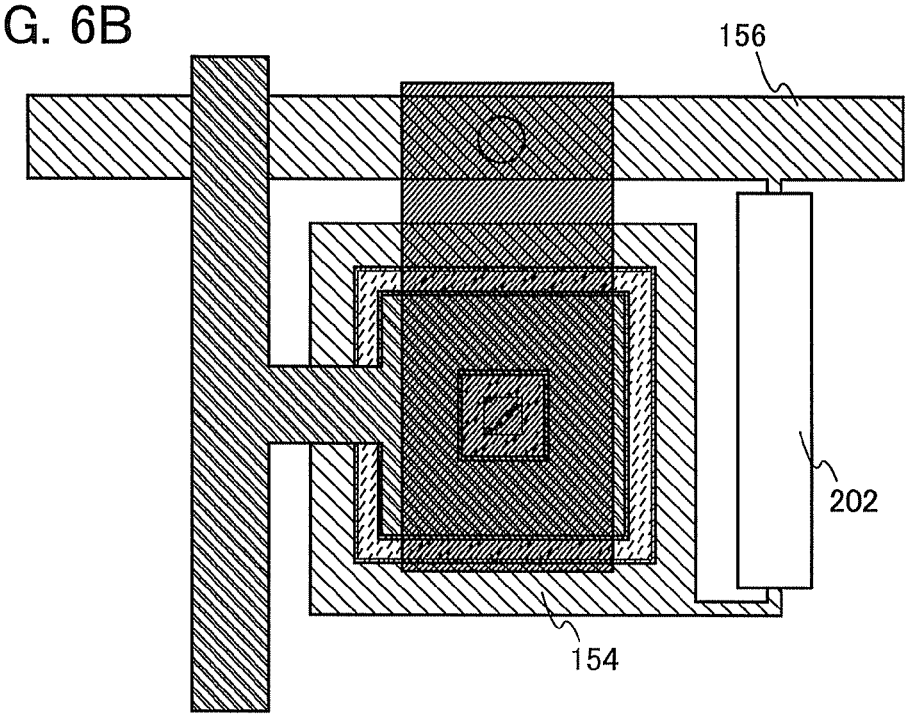

Alternatively, in FIGS. 1A and 1B, the first wiring 154 and the second wiring 156 may have a potential difference by providing a resistor 202 therebetween, instead of being independent form each other (FIG. 6B).

Here, when the resistance of the resistor 202 is $R_{202}$ and the current flowing to the resistor 200 is $I_{202}$, between the potential $V_H$ of a high-potential-side wiring (the second wiring 156) and the potential $V_L$ of a low-potential-side wiring (the first wiring 154), $V_H - V_L = I_{202} R_{202}$ is satisfied. Thus, by setting the resistance $R_{202}$ of the resistor 202 and the current $I_{202}$ flowing to the resistor 202 to be constant, a potential difference between the high-potential-side wiring (the second wiring 156) and the low-potential-side wiring (the first wiring 154) can be constant.

Figure 7A:
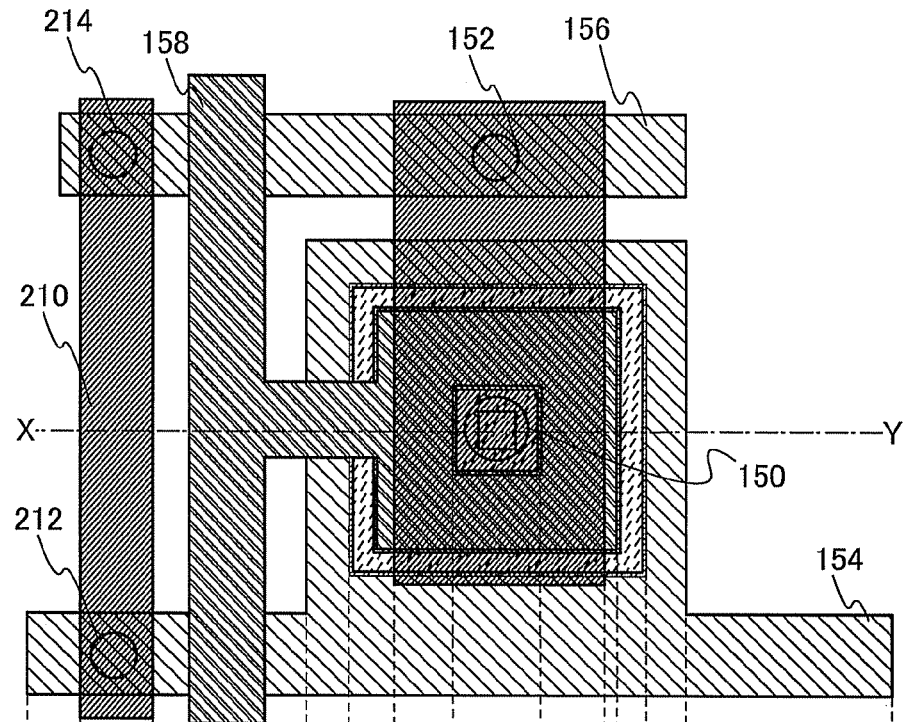
FIGS. 7A and 7B illustrate a photoelectric conversion element according to one embodiment of the present invention.
Figure 7B:
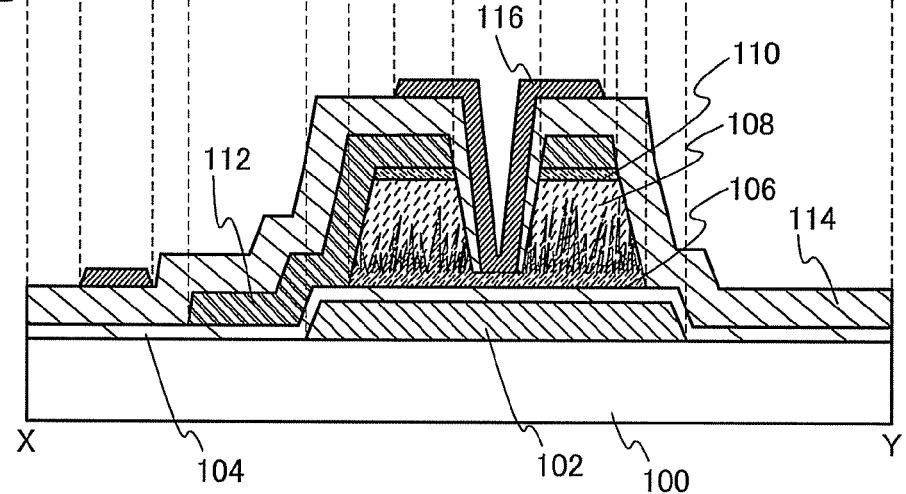

For the resistor 200 or the resistor 202, a highly resistant wiring 210 formed of the third conductive layer 116 can be used in the case where the conductivity of a material of the third conductive layer 116 is low, for example (FIGS. 7A and 7B). Here, the first wiring 154 is connected to the highly resistant wiring 210 in a third opening 212, and the second wiring 156 is connected to the highly resistant wiring 210 in a fourth opening 214.

Figure 8A:
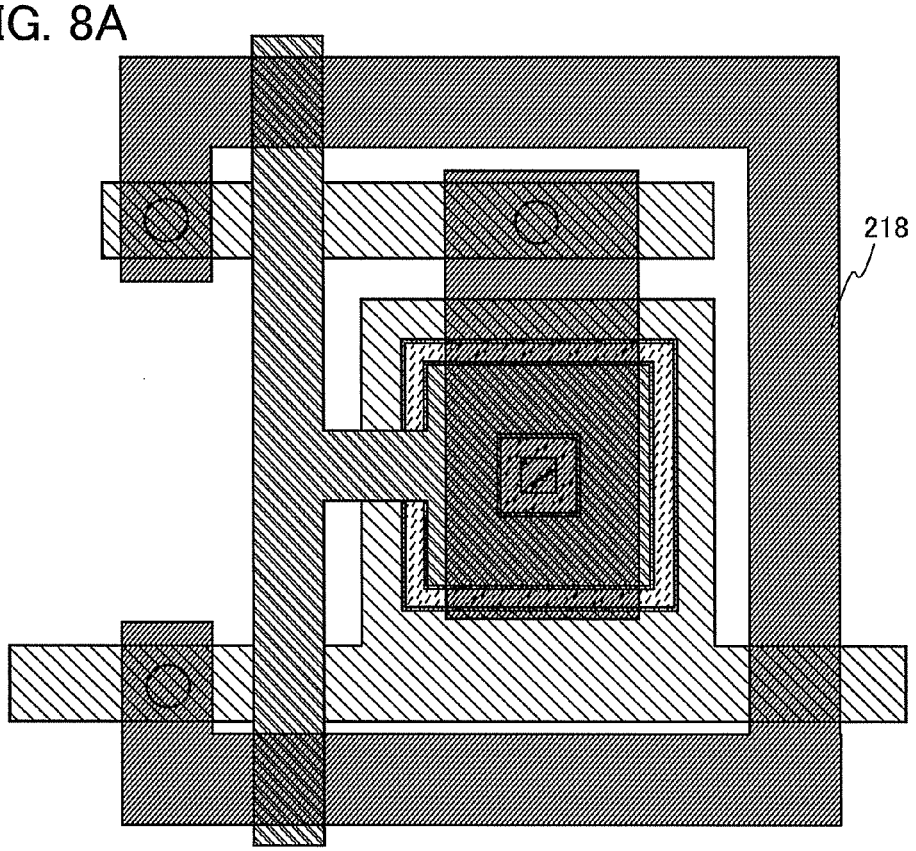
FIGS. 8A and 8B each illustrate a photoelectric conversion element according to one embodiment of the present invention.

When the conductivity of a material of the third conductive layer 116 is not sufficiently low, a highly resistant wiring 218 formed of the third conductive layer 116 is preferably provided so that the length of the highly resistant wiring 218 is long (FIG. 8A). When the length of the highly resistant wiring 218 is long, a sufficient potential difference can be generated between the first wiring 154 and the second wiring 156, which is preferable.

Figure 8B:
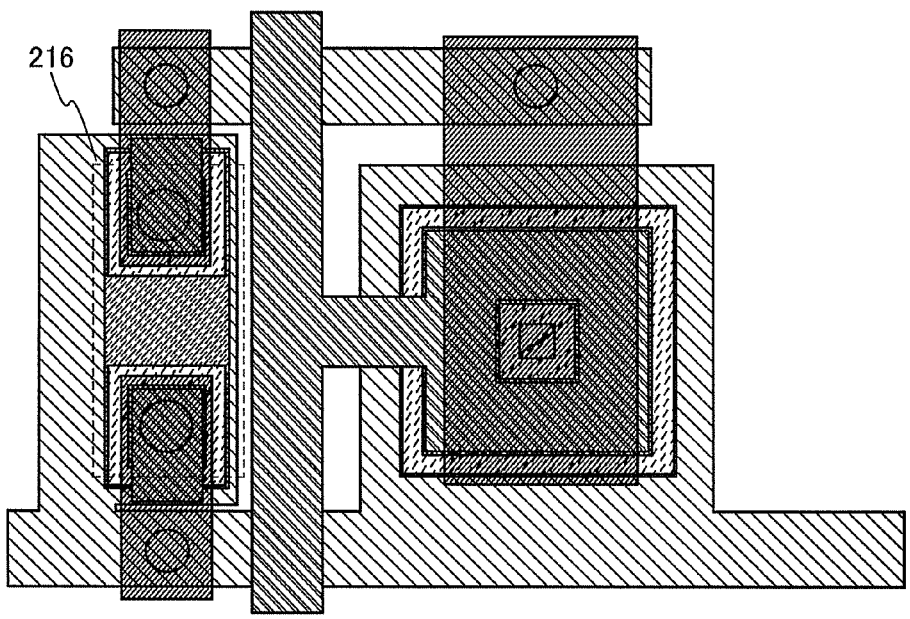

For the resistor 200 or the resistor 202, for example, a transistor can be used (FIG. 8B). FIG. 8B illustrates a structure where a transistor 216 is provided between the first wiring 154 and the second wiring 156. As illustrated in FIG. 8B, when the transistor 216 is used as a resistor, the channel length is preferably large and the channel width is preferably small. Further, the transistor and the photoelectric conversion element preferably have the same layered structures. Here, "the same layered structures" between a plurality of elements means that the shapes thereof seen in top views or cross-sectional views may be different from each other, but the stacking order of layers included in the layered structures is the same and the thicknesses of corresponding layers in the layered structures are equivalent to each other. That is to say, the plurality of elements has structures supposed to be manufactured through the same process.

Figure 9A:
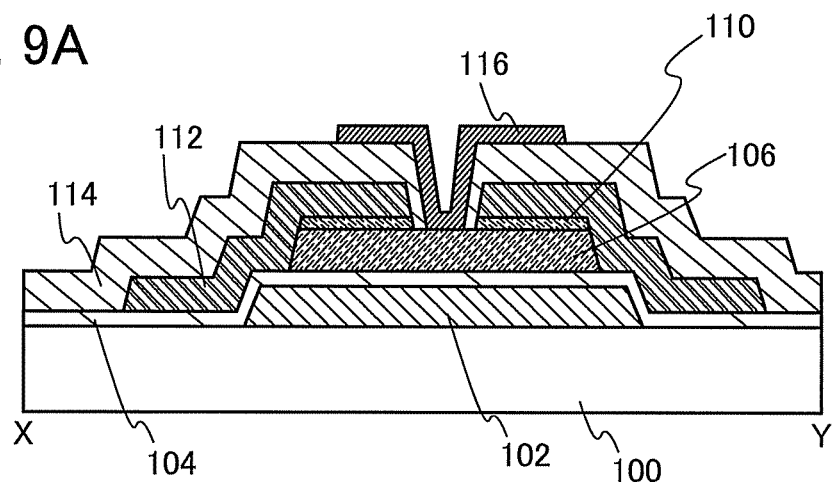
FIGS. 9A to 9C each illustrate a photoelectric conversion element according to one embodiment of the present invention.
Figure 9B:
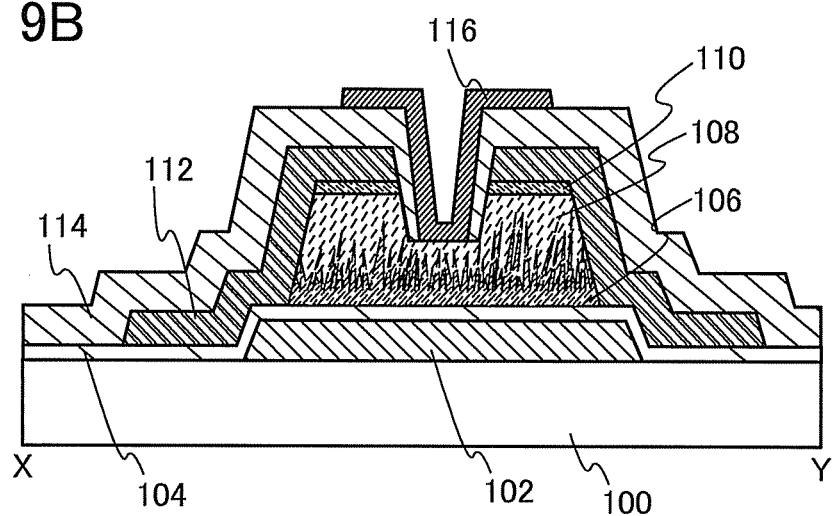
Figure 9C:
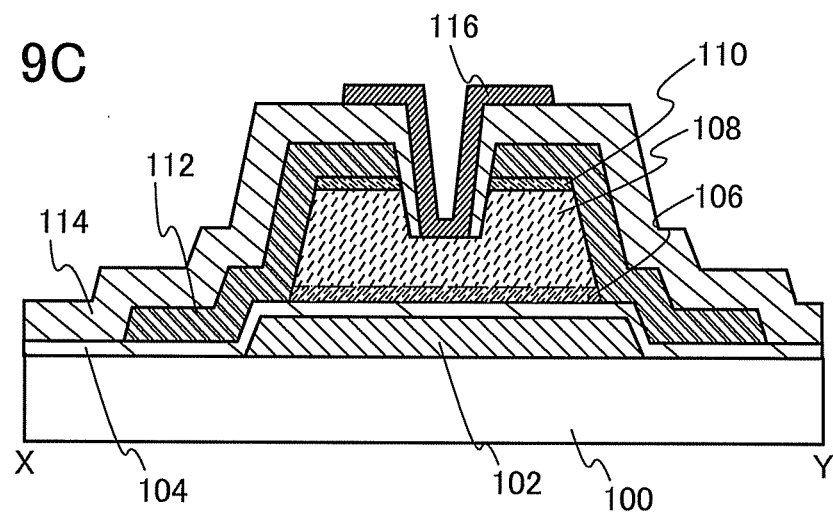

Note that a photoelectric conversion element according to one embodiment of the present invention is not limited to the structures illustrated in FIGS. 1A and 1B to FIGS. 8A and 8B. FIGS. 9A to 9C are cross-sectional views of photoelectric conversion elements according to other embodiments of the present invention.

For example, as illustrated in FIG. 9A, the first semiconductor layer and the third conductive layer may be in contact with each other without providing the second semiconductor layer.

Alternatively, as illustrated in FIG. 9B, the second semiconductor layer and the third conductive layer may be in contact with each other.

Note that the second semiconductor layer described above with reference to the drawing includes a microcrystalline semiconductor region that extend from the first semiconductor layer; however, one embodiment of the present invention is not limited thereto. A structure illustrated in FIG. 9C may be employed in which the microcrystalline semiconductor region does not extend in a conical or pyramidal shape from the first semiconductor layer, and the second semiconductor layer and the third conductive layer are in contact with each other.

Note that in the case where the photoelectric conversion element functions as an infrared sensor and the structure in FIG. 9B or 9C is employed, visible light is preferably removed from light incident on a light-receiving portion. This is because in the structures of FIGS. 9B and 9C, a portion overlapping with the light-receiving portion includes an amorphous semiconductor which has high sensitivity to visible light.

Note that by removing visible light from light incident on the light-receiving portion, the photoelectric conversion element can be used as an infrared sensor. Here, to remove visible light from light incident on the light-receiving portion, a filter that transmits light within an infrared range is needed. Thus, for example, all color filters of red, blue, and green may be provided so as to overlap with the light-receiving portion. Only in the case of outdoor application, it is preferable to suppress photodegradation by using a filter that transmits only light with a wavelength of approximately 950 nm because light with a wavelength of approximately 950 nm of solar spectrum at ground level is weak.

In this embodiment, the photoelectric conversion element according to one embodiment of the present invention is described above. With the structure described in this embodiment, the photoelectric conversion element can be obtained. Particularly in the case where a crystalline semiconductor (preferably, microcrystalline semiconductor) layer is used as the first semiconductor layer, even when the photoelectric conversion element is exposed to light with high intensity, photodegradation can be suppressed.

Embodiment 2

The photoelectric conversion element described in Embodiment 1 can be manufactured over the same substrate as a pixel of a display device through the same process as a pixel transistor. That is because the photoelectric conversion element described in Embodiment 1 has a shape obtained by modifying the shape of the pixel transistor of the display device.

Figure 10A:
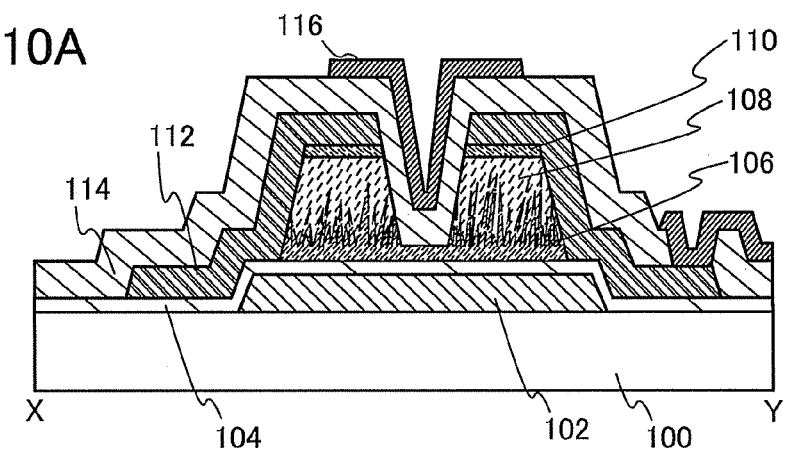
FIGS. 10A to 10D each illustrate a transistor according to an embodiment provided together with a photoelectric conversion element according to one embodiment of the present invention.

FIG. 10A illustrates a pixel transistor which can be formed over the same substrate as the photoelectric conversion element in FIG. 1B. The pixel transistor in FIG. 10A is different from the photoelectric conversion element in FIG. 1B in that the pixel transistor in FIG. 10A does not have a light-receiving portion where the first semiconductor layer and the third conductive layer are in contact with each other, and a pixel electrode formed of the third conductive layer is provided in contact with one of a source and a drain of the pixel transistor.

Figure 10B:
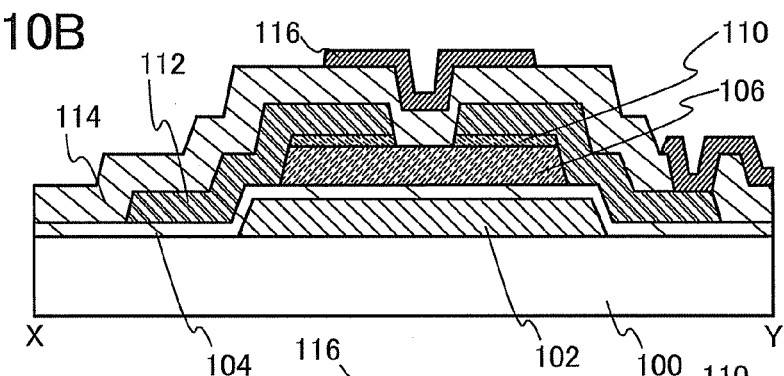

FIG. 10B illustrates a pixel transistor which can be formed over the same substrate as the photoelectric conversion element in FIG. 9A. The pixel transistor in FIG. 10B is different from the photoelectric conversion element in FIG. 9A in that the pixel transistor in FIG. 10B does not have a light-receiving portion where the first semiconductor layer and the third conductive layer are in contact with each other, and a pixel electrode formed of the third conductive layer is provided in contact with one of a source and a drain of the pixel transistor.

Figure 10C:
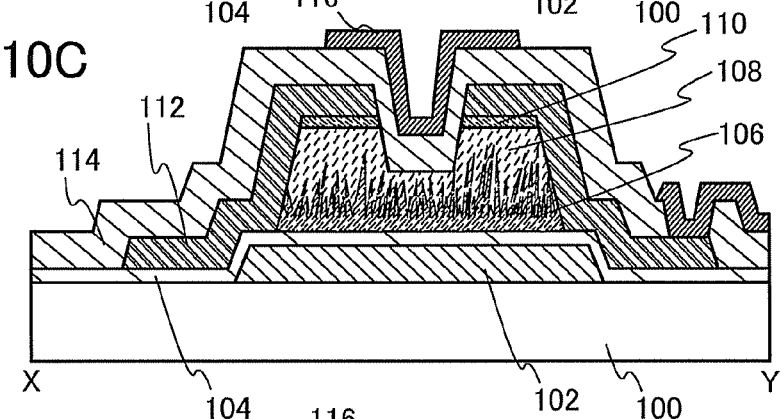

FIG. 10C illustrates a pixel transistor which can be formed over the same substrate as the photoelectric conversion element in FIG. 9B. The pixel transistor in FIG. 10C is different from the photoelectric conversion element in FIG. 9B in that the pixel transistor in FIG. 10C does not have a light-receiving portion where the second semiconductor layer and the third conductive layer are in contact with each other, and a pixel electrode formed of the third conductive layer is provided in contact with one of a source and a drain of the pixel transistor.

Figure 10D:
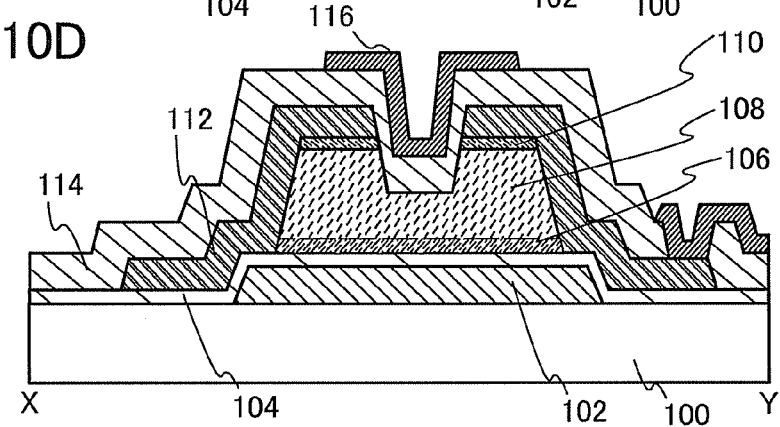

FIG. 10D illustrates a pixel transistor which can be formed over the same substrate as the photoelectric conversion element in FIG. 9C. The pixel transistor in FIG. 10D is different from the photoelectric conversion element in FIG. 9C in that the pixel transistor in FIG. 10D does not have a light-receiving portion where the second semiconductor layer and the third conductive layer are in contact with each other, and a pixel electrode formed of the third conductive layer is provided in contact with one of a source and a drain of the pixel transistor.

Note that in the transistors illustrated in FIGS. 10A to 10D, the third conductive layer is provided so as to overlap with a portion of the first semiconductor layer, which is to be a channel formation region, and the second insulating layer is provided between the first semiconductor layer and the third conductive layer. That is, a second gate electrode is formed of the third conductive layer and the second gate electrode functions as a back gate. In particular, the transistors having back gates in FIGS. 10A and 10B are preferable because the field effect mobility and the on-state current can be significantly increased as compared to the case where a back gate is not provided. Note that one embodiment of the present invention is not limited thereto, and the second gate electrode functioning as a back gate is not necessarily provided.

Note that the transistors illustrated in FIGS. 10A, 10C, and 10D each includes the second semiconductor layer which enables reduction in off-state current.

Therefore, the transistor in FIG. 10A can have a higher on/off ratio and more excellent switching characteristics than any other transistor. Thus, when the transistor in FIG. 10A is applied to a pixel transistor of a display device, the display device can have a higher contrast ratio. Based on the above, it can be said that the structure in FIG. 10A is the most preferred embodiment among the structures in FIGS. 10A to 10D.

In this embodiment, a method for manufacturing the photoelectric conversion element of Embodiment 1 and the pixel transistor of the display device which are formed over the same substrate through the same process will be described. Note that in the following description, the same layer as the layer described in Embodiment 1, or the like, is denoted by a common reference numeral.

Figure 11A:
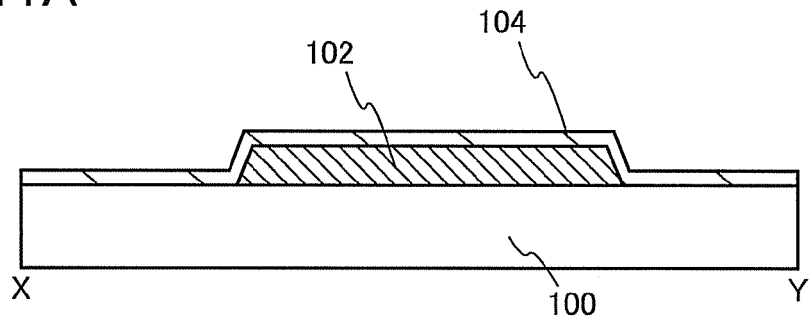
FIGS. 11A to 11D are first views illustrating a method for manufacturing a photoelectric conversion element according to one embodiment and a transistor provided over the same substrate as the photoelectric conversion element.

First, the first conductive layer 102 is formed over the substrate 100, and the first insulating layer 104 is formed so as to cover the first conductive layer 104 (FIG. 11A).

The substrate 100 is an insulating substrate. A glass substrate or a quartz substrate can be used as the substrate 100, for example. A glass substrate is used in this embodiment. In the case where the substrate 100 is mother glass, the substrate may have any of the sizes from the first generation (e.g., 320 mm×400 mm) to the tenth generation (e.g., 2950 mm×3400 mm); however, the substrate is not limited thereto.

The first conductive layer 102 may be formed in such a manner that a conductive film (e.g., a metal film or a semiconductor film to which an impurity element imparting one conductivity type is added) is formed, a resist mask is formed over the conductive film, and etching is performed using the resist mask. Alternatively, an ink-jet method may be used. Note that the conductive film to be the first conductive layer 102 may be formed to have either a single-layer structure or a layered structure including a plurality of layers. Here, the conductive film is formed to have a three-layer structure in which an Al layer is sandwiched between Ti layers, for example. Note that the first conductive layer 102 forms at least a scan line and a gate electrode.

The first insulating layer 104 may be formed using an insulating material (e.g., silicon nitride, silicon nitride oxide, silicon oxynitride, or silicon oxide). Note that the first insulating layer 104 may be formed to have either a single-layer structure or a layered structure including a plurality of layers. Here, the first insulating layer 104 is formed to have two-layer structure in which a silicon oxynitride layer is stacked over a silicon nitride layer, for example. Note that the first insulating layer 104 forms at least a gate insulating layer.

"Silicon nitride oxide" contains oxygen and nitrogen so that the nitrogen content is higher than the oxygen content, and in the case where measurements are performed using Rutherford backscattering spectrometry (RBS) and hydrogen forward scattering (HFS), preferably contains oxygen, nitrogen, silicon, and hydrogen at 5 at. % to 30 at. %, 20 at. % to 55 at. %, 25 at. % to 35 at. %, and 10 at. % to 30 at. %, respectively.

"Silicon oxynitride" contains oxygen and nitrogen so that the oxygen content is higher than the nitrogen content, and in the case where measurements are performed using RBS and HFS, preferably contains oxygen, nitrogen, silicon, and hydrogen at 50 at. % to 70 at. %, 0.5 at. % to 15 at. %, 25 at. % to 35 at. %, and 0.1 at. % to 10 at. %, respectively.

Note that percentages of nitrogen, oxygen, silicon, and hydrogen fall within the ranges given above, where the total number of atoms contained in the silicon oxynitride or the silicon nitride oxide is defined as 100 at. %.

Figure 11B:
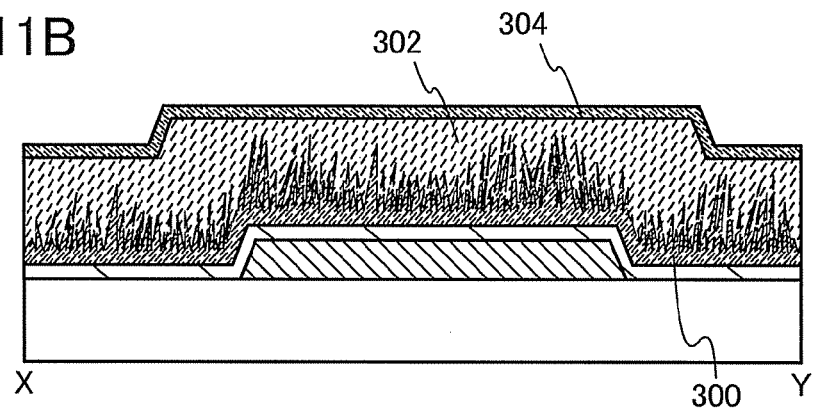

Next, over the first insulating layer 104, a first semiconductor film 300 to be the first semiconductor layer 106, a second semiconductor film 302 to be the second semiconductor layer 108, and an impurity semiconductor film 304 to be the impurity semiconductor layer 110 are formed (FIG. 11B).

The first semiconductor film 300 is preferably formed using a semiconductor material having high carrier mobility. As the semiconductor material having high carrier mobility, a crystalline semiconductor can be given, for example. As the crystalline semiconductor, a microcrystalline semiconductor can be given, for example. Here, a microcrystalline semiconductor is a semiconductor having an intermediate structure between an amorphous structure and a crystalline structure (including a single crystal structure and a polycrystalline structure). A microcrystalline semiconductor is a semiconductor having a third state that is stable in terms of free energy and is a crystalline semiconductor having short-range order and lattice distortion, in which columnar or needle-like crystals having a grain size of 2 nm or more and 200 nm or less, preferably 10 nm or more and 80 nm or less, more preferably 20 nm or more and 50 nm or less have grown in a direction of the normal to the substrate surface. Thus, there is a case where crystal grain boundaries are formed at the interface of the columnar or needle-like crystal grains. Note that the diameter of the grain here means the maximum diameter of the crystal grain in a plane parallel to the substrate surface. Further, the crystal grain includes an amorphous semiconductor region and a crystallite which is a minute crystal that can be regarded as a single crystal. The crystal grain may include a twin crystal.

Microcrystalline silicon which is one of microcrystalline semiconductors has a peak of Raman spectrum which is shifted to a lower wave number than 520 cm$^{-1}$ that represents single crystal silicon. That is, the peak of the Raman spectrum of the microcrystalline silicon exists between 520 cm$^{-1}$ which represents single crystal silicon and 480 cm$^{-1}$ which represents amorphous silicon. Further, the microcrystalline silicon contains hydrogen or halogen of at least 1 at. % or more in order to terminate a dangling bond. Furthermore, the microcrystalline silicon contains a rare gas element such as He, Ar, Kr, or Ne to further promote lattice distortion, so that stability is increased and a favorable microcrystalline semiconductor can be obtained.

Moreover, when the concentration of oxygen and nitrogen contained in the first semiconductor film 300 (measured by secondary ion mass spectrometry) is less than $1 \times 10^{18}$ cm$^{-3}$, the crystallinity of the first semiconductor film 300 can be increased.

The second semiconductor film 302 is preferably formed using a semiconductor material having low carrier mobility in order to serve as a buffer layer, and preferably includes an amorphous semiconductor and a minute semiconductor crystal grain. In addition, the second semiconductor film 302 has lower energy at the Urbach edge, which is measured by a constant photocurrent (CPM) method or photoluminescence spectrometry, and a smaller quantity of absorption spectra of defects, as compared to a conventional amorphous semiconductor film. That is, as compared to the conventional amorphous semiconductor film, such a semiconductor film is a well-ordered semiconductor film which has few defects and a steep tail slope of a level at a band edge (a mobility edge) in the valence band. Note that such a semiconductor film is referred to as a "film containing an amorphous semiconductor" or a "layer containing an amorphous semiconductor" in this specification.

The second semiconductor film 302 is preferably "a film containing an amorphous semiconductor", "a film containing an amorphous semiconductor" which contains halogen, or "a film containing an amorphous semiconductor" which contains nitrogen, most preferably "a film containing an amorphous semiconductor" which contains an NH group or an $NH_2$ group. Note that one embodiment of the present invention is not limited thereto.

A region (also referred to as an interface region) of the second semiconductor film 302 which is closer to the first semiconductor film 300 includes microcrystalline semiconductor regions which extend in conical or pyramidal shapes from the first semiconductor film 300 and a "film containing an amorphous semiconductor" which is similar to the second semiconductor film 302.

When the second semiconductor film 302 is formed using a "film containing an amorphous semiconductor", a "film containing an amorphous semiconductor" which contains halogen, a "film containing an amorphous semiconductor" which contains nitrogen, or a "film containing an amorphous semiconductor" which contains an NH group or an $NH_2$ group, for example, the off-state current of a transistor can be reduced. Further, since the interface region has the conical or pyramidal microcrystalline semiconductor regions, resistance in the vertical direction (the film thickness direction), that is, resistance between the second semiconductor film 302 and a source region or a drain region formed of the impurity semiconductor film 304, can be lowered. Thus, the on-state current of the transistor can be increased. That is to say, as compared to the case of using the conventional amorphous semiconductor, the off-state current can be sufficiently reduced and reduction in on-state current can be suppressed; thus, switching characteristics of the transistor can be improved.

Note that as the first semiconductor layer 106 is thinner in the completed transistor, the on-state current is decreased. As the first semiconductor layer 106 is thicker in the completed transistor, the off-state current is increased because a contact area between the first semiconductor layer 106 and the second conductive layer 112 is increased. Therefore, to increase the on/off ratio, it is preferable to form the first semiconductor film 300 to be the first semiconductor layer 106 to have a large thickness and further to perform insulation treatment to make side surfaces of a thin film layered body 306 including the first semiconductor layer 106 have an insulating property.

A large portion of the above microcrystalline semiconductor region preferably includes a crystal grain having a conical or pyramidal shape whose top gets narrower from the first insulating layer 104 toward the second semiconductor film 302. Alternatively, the large portion of the above microcrystalline semiconductor region may include a crystal grain having a conical or pyramidal shape whose top gets wider from the first insulating layer 104 toward the second semiconductor film 302.

When the microcrystalline semiconductor region includes a crystal grain having a conical or pyramidal shape whose top gets narrower from the first insulating layer 104 toward the second semiconductor film 302 in the above interface region, the proportion of the microcrystalline semiconductor region on the first semiconductor film 300 side is higher than that on the second semiconductor film 302 side. The microcrystalline semiconductor region grows from a surface of the first semiconductor film 300 in the film thickness direction. When the flow rate of hydrogen with respect to that of silane in a source gas is low (that is, the dilution ratio is low) or the concentration of a source gas containing nitrogen is high, crystal growth of the microcrystalline semiconductor region is suppressed, and thus, a crystal grain comes to have a conical or pyramidal shape, and a large portion of the deposited semiconductor is amorphous.

The above interface region preferably contains nitrogen, in particular, an NH group or an $NH_2$ group. This is because defects are reduced and carriers flow easily when nitrogen, in particular, an NH group or an $NH_2$ group is bonded with dangling bonds of silicon atoms at an interface of crystal included in the microcrystalline semiconductor region or at an interface between the microcrystalline semiconductor region and the amorphous semiconductor region. Accordingly, by setting the concentration of nitrogen, preferably, an NH group or an $NH_2$ group to $1\times10^{20}$ cm$^{-3}$ to $1\times10^{21}$ cm$^{-3}$, the dangling bonds of silicon atoms can be easily cross-linked with nitrogen, preferably an NH group or an $NH_2$ group, so that carriers can flow easily. As a result, a bond which promotes the carrier transfer is formed at a crystal grain boundary or a defect, whereby the carrier mobility of the interface region is increased. Therefore, the field effect mobility of the transistor is improved.

Further, when the concentration of oxygen in the interface region is reduced, defects at the interface between the microcrystalline semiconductor region and the amorphous semiconductor region or the interface between crystal grains can be reduced, so that bonds which inhibit carrier transfer can be reduced.

Here, when the distance from the interface of the first insulating layer 104 and the first semiconductor film 300 to the edge of a step portion of the second semiconductor film 302 is greater than or equal to 3 nm and less than or equal to 80 nm, preferably greater than or equal to 5 nm and less than or equal to 30 nm, the off-state current of the transistor can be effectively reduced.

The impurity semiconductor film 304 is formed using a semiconductor to which an impurity element imparting one conductivity type is added. When the transistor is an n-channel transistor, phosphorus (P) or arsenic (As) is used as the impurity element imparting one conductivity type, for example. Meanwhile, when the transistor is a p-channel transistor, for example, boron (B) is used as the impurity element imparting one conductivity type, for example. Note that it is preferable that the transistor be an n-channel transistor. Therefore, for example, silicon to which phosphorus (P) is added is used here. The impurity semiconductor film 304 may be formed using an amorphous semiconductor or a crystalline semiconductor such as a microcrystalline semiconductor.

When the impurity semiconductor film 304 is formed using an amorphous semiconductor, the flow rate of a dilution gas is greater than or equal to that of a deposition gas and less than or equal to 10 times that of the deposition gas, preferably greater than or equal to that of the deposition gas and less than or equal to 5 times that of the deposition gas. On the other hand, when the impurity semiconductor film 304 is formed using a crystalline semiconductor, the flow rate of the dilution gas is greater than or equal to 10 times that of a deposition gas and less than or equal to 2000 times that of the deposition gas, preferably greater than or equal to 50 times that of the deposition gas and less than or equal to 200 times that of the deposition gas.

Figure 11C:
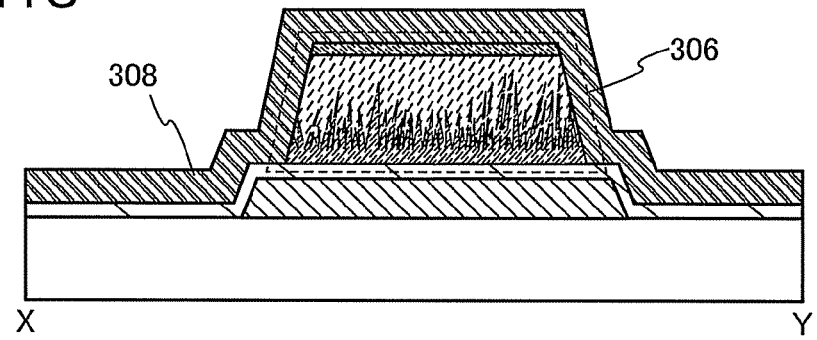

Next, a resist mask is formed over the impurity semiconductor film 304, and the first semiconductor film 300, the second semiconductor film 302, and the impurity semiconductor film 304 are etched using the resist mask, so that the thin film layered body 306 is formed. Then, a conductive film 308 is formed over the first insulating layer 104 and the thin film layered body 306 (FIG. 11C).

The conductive film 308 may be formed using a conductive material (e.g., metal or a semiconductor to which an impurity element imparting one conductivity type is added) in a manner similar to that of the first conductive layer 102. Note that the conductive film 308 may have a single-layer structure or a layered structure including plural layers. Here, a three-layer structure in which an Al layer is sandwiched between Ti layers is employed, for example.

Note that it is preferable to perform insulation treatment to make the side surfaces of the thin film layered body 306 have an insulating property. That is because the off-state current increases when the first semiconductor layer 106 and the second conductive layer 112 of the completed transistor are in contact with each other. Here, for the insulation, the side surfaces of the thin film layered body 306 may be exposed to nitrogen plasma. Alternatively, the insulation may be performed as follows: an insulating film is formed while the side surfaces of the thin film layered body 306 are exposed, and the insulating film is etched in the direction perpendicular to a surface of the substrate 100 by an etching method with high anisotropy, so that side wall insulating layers are formed in contact with the side surfaces of the thin film layered body 306.

Figure 11D:
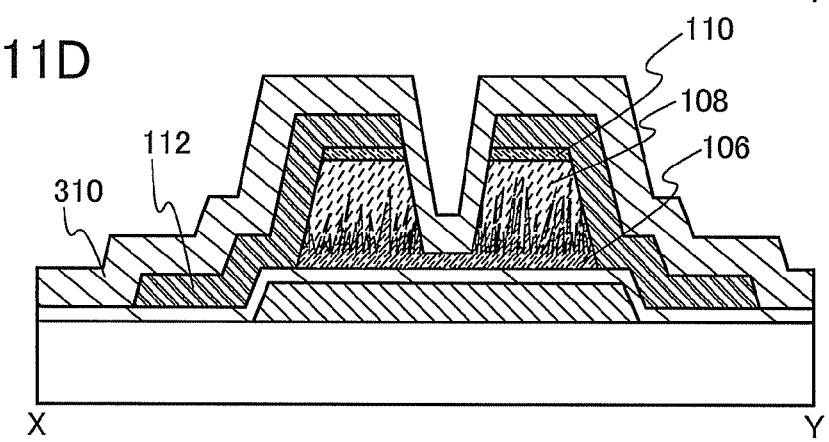

Then, a resist mask is formed over the conductive film 308, and the conductive film 308 is etched using the resist mask, whereby the second conductive layer 112 is formed. Further, in the above step, an upper portion of the thin film layered body 306 may also be etched so that the first semiconductor layer 106, the second semiconductor layer 108, and the impurity semiconductor layer 110 are formed. Alternatively, after removal of the resist mask, etching may be performed using the second conductive layer 112 as a mask so that the first semiconductor layer 106, the second semiconductor layer 108, and the impurity semiconductor layer 110 are formed. After that, an insulating film 310 is formed so as to cover these layers (FIG. 11D). Note that the second conductive layer 112 forms at least a signal line, and source and drain electrodes.

Figure 12A:
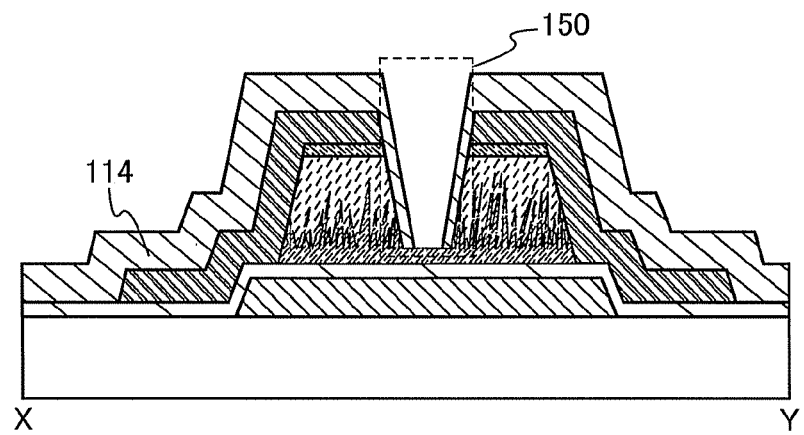
FIGS. 12A to 12C are second views illustrating a method for manufacturing the photoelectric conversion element, which follow the method for manufacturing the photoelectric conversion element in the first views of FIGS. 11A to 11D.

Note that in the following description, a method for manufacturing a photoelectric conversion element and a method for manufacturing a transistor will be described with reference to respective drawings. That is to say, FIGS. 12A to 12C illustrates a method for manufacturing a photoelectric conversion element, and FIGS. 13A to 13C illustrates a method for manufacturing a transistor.

Next, a plurality of openings is formed in the insulating film 310, whereby the insulating layer 114 is formed. The plurality of openings is formed in such a manner that a resist mask is formed over the insulating film 310 and etching is performed using the resist mask. Preferably, the first opening 150 (FIGS. 1A and 1B and FIG. 12A) is formed first, and then, the second opening 152 (FIG. 1A) and a pixel opening 314 (FIG. 13A) are formed. Note that one embodiment of the present invention is not limited thereto, and the first opening 150, the second opening 152, and the pixel opening 314 may be formed through different processes. Alternatively, the second opening 152 may be formed first, and then, the first opening 150 and the pixel opening 314 may be formed. Still alternatively, the pixel opening 314 may be formed first, and then the first opening 150 and the second opening 152 may be formed. Further alternatively, the first opening 150, the second opening 152, and the pixel opening 314 may be formed through the same etching process. In a later step, in the pixel opening 314, a pixel electrode formed of the third conductive layer 116 is formed in contact with one of a source and a drain of a pixel transistor (FIG. 12A and FIG. 13A).

Figure 12B:
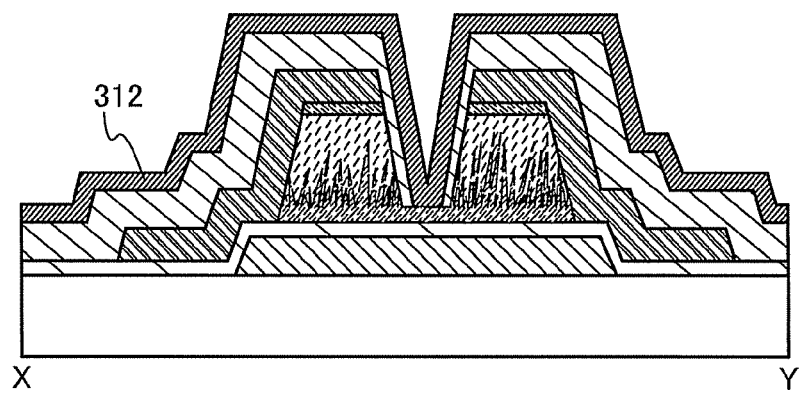
Figure 12C:
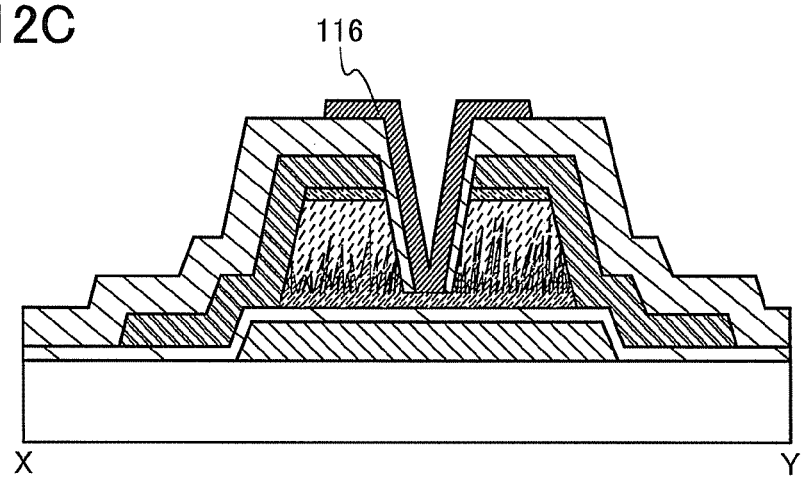
Figure 13A:
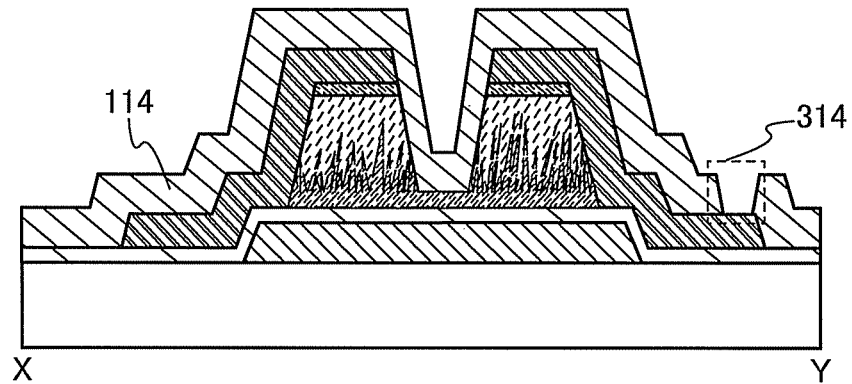
FIGS. 13A to 13C are second views illustrating a method for manufacturing the transistor, which follow the method for manufacturing the transistor in the first views of FIGS. 11A to 11D.
Figure 13B:
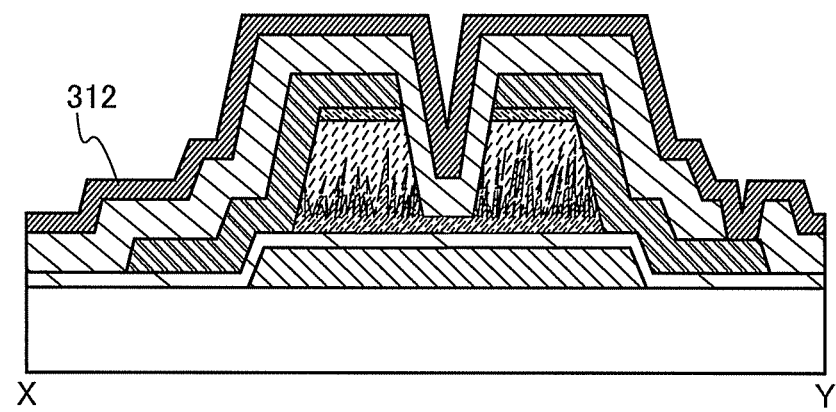
Figure 13C:
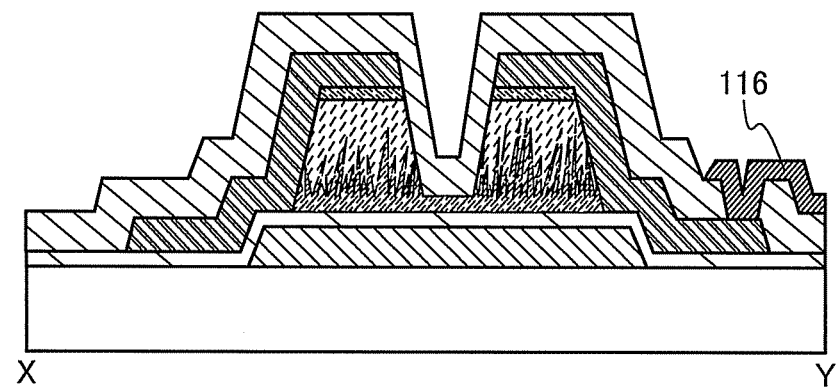

Then, a conductive film 312 to be the third conductive layer 116 is formed over the second insulating layer 114 in which the first opening 150, the second opening 152, and the pixel opening 314 are formed (FIG. 12B and FIG. 13B). Since the third conductive layer 116 forms a pixel electrode connected to the pixel transistor and needs to transmit light in a light-receiving portion, the conductive film 312 is formed using a light-transmitting material.

The conductive film 312 can be formed using a conductive composition including a conductive macromolecule (also referred to as a conductive polymer) having a light-transmitting property. It is preferable that the conductive film 312 formed using the conductive composition have a sheet resistance of less than or equal to 10000 Ω/square and a light transmittance of greater than or equal to 70% at a wavelength of 550 nm. Further, the resistivity of the conductive macromolecule included in the conductive composition is preferably less than or equal to 0.1 Ω·cm.

As the conductive macromolecule, a so-called π-electron conjugated conductive polymer can be used. For example, polyaniline or a derivative thereof, polypyrrole or a derivative thereof, polythiophene or a derivative thereof, and a copolymer of two or more of aniline, pyrrole, and thiophene or a derivative thereof can be given.

The conductive film 312 can be formed using, for example, an indium oxide containing a tungsten oxide, an indium zinc oxide containing a tungsten oxide, an indium oxide containing a titanium oxide, an indium tin oxide containing a titanium oxide, an indium tin oxide (hereinafter referred to as ITO), an indium zinc oxide, an indium tin oxide to which a silicon oxide is added, or the like.

The conductive film 312 may be formed by processing a film which is formed using any of the above materials by a photolithography method.

Then, a resist mask is formed over the conductive film 312, and the conductive film 312 is etched using the resist mask, whereby the third conductive layer 116 is formed (FIG. 12C and FIG. 13C).

In a manner described above, a photoelectric conversion element (FIG. 12C) and a transistor (FIG. 13C) can be provided over the substrate 100.

Although not illustrated, an insulating layer formed using an organic resin by a spin coating method or the like may be provided between the second insulating layer 114 and the third conductive layer 116.

Embodiment 3

As described in Embodiment 2, a photoelectric conversion element according to one embodiment of the present invention can be provided over the same substrate as a pixel transistor of a display device.

In this embodiment, one embodiment of a display device including a photoelectric conversion element according to one embodiment of the present invention will be described with reference to a drawing.

Note that a display element included in a display device according to one embodiment of the present invention is not particularly limited and may be a liquid crystal element, a light-emitting element, an electrophoretic element, or the like. In the case where a display device is a liquid crystal display device provided with a liquid crystal element, it is preferably a field-sequential liquid crystal display device because power consumption can be reduced.

In a display device according to this embodiment, a signal line driver circuit and a scan line driver circuit may be formed over a different substrate (e.g., a semiconductor substrate or an SOI substrate) and then connected to a pixel portion or may be formed over the same substrate as a pixel circuit.

Note that there is no particular limitation on a connecting method in the case of using a different substrate, and a COG method, a wire bonding method, a TAB method, or the like can be used. Further, a connection position is not particularly limited as long as electrical connection is possible. Note also that a controller, a CPU, a memory, and the like may be formed separately and connected to the pixel circuit.

Any of the above can be employed as long as a photoelectric conversion element and a pixel transistor are provided over the same substrate.

Figure 14:
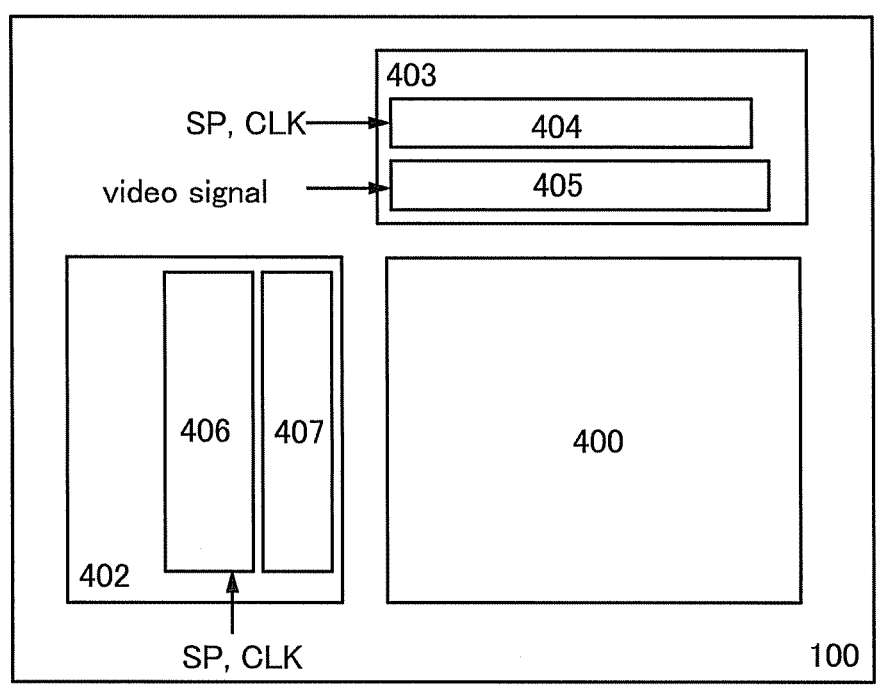
FIG. 14 illustrates an example of a display device according to one embodiment of the present invention.

FIG. 14 is a block diagram of a display device. The display device in FIG. 14 includes, over the substrate 100, a pixel portion 400 including a plurality of pixels each provided with a display element, a scan line driver circuit 402 which selects a pixel, and a signal line driver circuit 403 which controls input of a video signal to the selected pixel.

The signal line driver circuit 403 in FIG. 14 includes a shift register 404 and an analog switch 405. A clock signal (CLK) and a start pulse signal (SP) are input to the shift register 404. When the clock signal (CLK) and the start pulse signal (SP) are input, a timing signal is generated in the shift register 404 and input to the analog switch 405.

Note that a video signal is supplied to the analog switch 405. The analog switch 405 samples the video signal in accordance with the input timing signal and supplies the sampled signal to a signal line of the next stage.

Note that the display device is not limited to the structure illustrated in FIG. 14. That is, the signal line driver circuit is not limited to a structure including only a shift register and an analog switch. In addition to the shift register and the analog switch, another circuit such as a buffer, a level shifter, or a source follower may be provided. Note that the shift register and the analog switch are not necessarily provided. For example, another circuit such as a decoder circuit by which a signal line can be selected may be used instead of the shift register, or a latch or the like may be used instead of the analog switch.

The scan line driver circuit 402 in FIG. 14 includes a shift register 406 and a buffer 407. The scan line driver circuit 402 may include a level shifter. In the scan line driver circuit 402, when the clock signal (CLK) and the start pulse signal (SP) are input to the shift register 406, a selection signal is generated. The generated selection signal is buffered and amplified by the buffer 407, and the buffered and amplified signal is supplied to a corresponding scan line. Gates of pixel transistors of one line are connected to the scan line. Further, since the pixel transistors of one line need to be turned on at the same time in the operation, the buffer 407 which can supply a large amount of current is used.

In a full-color display device, when video signals corresponding to R (red), G (green), and B (blue) are sequentially sampled and supplied to corresponding signal lines, the number of terminals for connecting the shift register 404 and the analog switch 405 corresponds to approximately ⅓ of the number of terminals for connecting the analog switch 405 and the signal line of the pixel portion 400. Thus, in comparison to the case where the analog switch 405 and the pixel portion 400 are formed over different substrates, the number of terminals used for connection to a substrate which is separately provided can be reduced when the analog switch 405 and the pixel portion 400 are formed over one substrate. Accordingly, occurrence probability of bad connection can be suppressed and yield can be improved.

Note that although the scan line driver circuit 402 in FIG. 14 includes the shift register 406 and the buffer 407, one embodiment of the present invention is not limited thereto. The scan line driver circuit 402 may be formed using only the shift register 406.

Note that the structures of the signal line driver circuit and the scan line driver circuit are not limited to the structure illustrated in FIG. 14, which are merely one embodiment of the display device.

A photoelectric conversion element according to one embodiment of the present invention may be provided over any portion of the substrate 100 over which the display device described in this embodiment is provided. For example, the photoelectric conversion element may be provided for every several pixels of some of pixels in the pixel portion 400. Alternatively, the photoelectric conversion element may be provided so as to be included in the scan line driver circuit 402 over the substrate 100. Still alternatively, the photoelectric conversion element may be provided so as to be included in the signal line driver circuit 403. Further alternatively, the photoelectric conversion element according to one embodiment of the present invention may be provided in a region except for the pixel portion 400, the scan line driver circuit 402, and the signal line driver circuit 403.

Note that in the case where the photoelectric conversion element is provided for every several pixels of some of the pixels in the pixel portion 400, the display device can be a touchscreen utilizing the element. In that case, a touchscreen method is preferably a frustrated total internal reflection method (FTIR method) or an infrared block method.

A FTIR method refers to a method in which infrared light and an acrylic panel are used, and when infrared light delivered to side surfaces of the acrylic panel is totally reflected due to the relation between the refractive indices of the acrylic panel and the air and then diffuse reflection occurs instead of the total internal reflection in a contact area of a surface of the acrylic panel, the diffusely-reflected infrared light is detected. On the other hand, an infrared block method refers to a method in which when infrared light delivered from the backlight side is blocked in a contact area of a surface of a display panel, a portion shielded from the infrared light is detected.

Note that the size of the photoelectric conversion element provided over the substrate 100 may be equivalent to that of the pixel transistor but is preferably larger than that of the pixel transistor.

Embodiment 4

The photoelectric conversion element described in Embodiment 1 and the display device described in Embodiment 3 can be used in electronic devices. Examples of electronic devices are a television set (also referred to as a television or a television receiver), a monitor of a computer, electronic paper, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 15A:
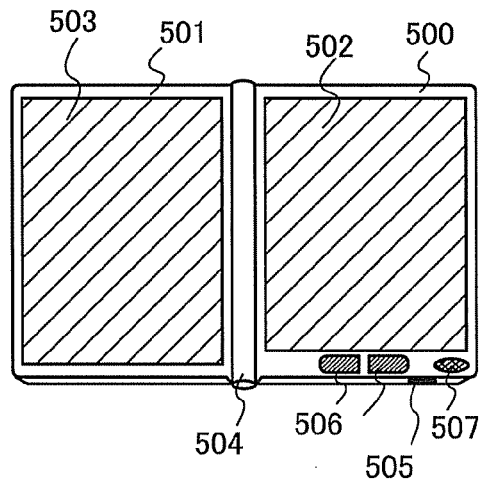
FIGS. 15A to 15C each illustrate an example of an electronic device according to one embodiment of the present invention.

FIG. 15A illustrates an example of an e-book reader. The e-book reader illustrated in FIG. 15A includes a housing 500 and a housing 501. The housing 500 and the housing 501 are combined with a hinge 504 so that the e-book reader can be opened and closed. With such a structure, the e-book reader can be handled like a paper book.

A display portion 502 and a display portion 503 are incorporated in the housing 500 and the housing 501, respectively. The display portion 502 and the display portion 503 may display one image or different images. In the case where the display portion 502 and the display portion 503 display different images, for example, a display portion on the right side (the display portion 502 in FIG. 15A) can display text and a display portion on the left side (the display portion 503 in FIG. 15A) can display graphics. The display device described in Embodiment 3 can be applied to the display portions 502 and 503.

In FIG. 15A, the housing 500 is provided with a power input terminal 505, an operation key 506, a speaker 507, and the like. The operation key 506 may have, for example, a function of turning pages. Note that a keyboard, a pointing device, and the like may be provided on the surface of the housing, on which the display portion of the housing is provided. Further, an external connection terminal (an earphone terminal, a USB terminal, a terminal that can be connected to various cables such as a USB cable, or the like), a recording medium insertion portion, and the like may be provided on the back surface or the side surface of the housing. Note that the e-book reader in FIG. 15A may further have a structure with which data can be transmitted and received wirelessly.

Figure 15B:
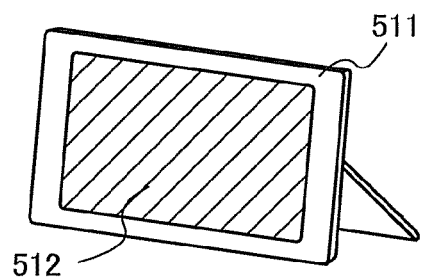

FIG. 15B illustrates an example of a digital photo frame. In the digital photo frame illustrated in FIG. 15B, a display portion 512 is incorporated in a housing 511. The display device described in Embodiment 3 can be applied to the display portion 512.

Note that the digital photo frame illustrated in FIG. 15B may be provided with an operation portion, an external connection terminal (a USB terminal, a terminal that can be connected to various cables such as a USB cable, or the like), a recording medium insertion portion, and the like. Although they may be provided on the surface on which the display portion is provided, it is preferable to provide them on the side surface or the back surface for the design of the digital photo frame. For example, a memory storing data of an image shot by a digital camera is inserted in the recording medium insertion portion of the digital photo frame, whereby the image data can be transferred and displayed on the display portion 512. The digital photo frame in FIG. 15B may further have a structure with which data can be transmitted and received wirelessly.

Figure 15C:
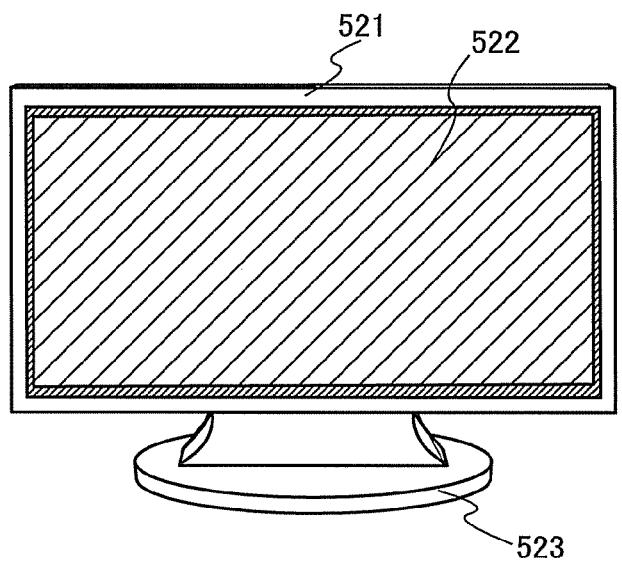

FIG. 15C illustrates an example of a television set. In the television set illustrated in FIG. 15C, a display portion 522 is incorporated in a housing 521. The housing 521 is supported by a stand 523. The display device described in Embodiment 3 can be applied to the display portion 522.

The television set illustrated in FIG. 15C can be operated by an operation switch of the housing 521 or a separate remote controller. Channels and volume can be controlled by an operation key of the remote controller so that an image displayed on the display portion 522 can be controlled. Further, the remote controller may be provided with a display portion for displaying data output from the remote controller.

Note that the television set illustrated in FIG. 15C is provided with a receiver, a modem, and the like. With the receiver, a general television broadcast can be received. Further, when the television set is connected to a communication network by wired or wireless connection via the modem, one-way (from a transmitter to a receiver) or two-way (between a transmitter and a receiver or between receivers) data communication can be performed.

Note that an electronic device including a photoelectric conversion element according to one embodiment of the present invention is preferably an electronic signboard constantly placed outside. This is because, as described in Embodiment 1, in the case of using a crystalline semiconductor (preferably, microcrystalline semiconductor) layer as a first semiconductor layer of a photoelectric conversion element according to one embodiment of the present invention, photodegradation can be suppressed even when the photoelectric conversion element is exposed to light with high intensity.

Figure 16A:
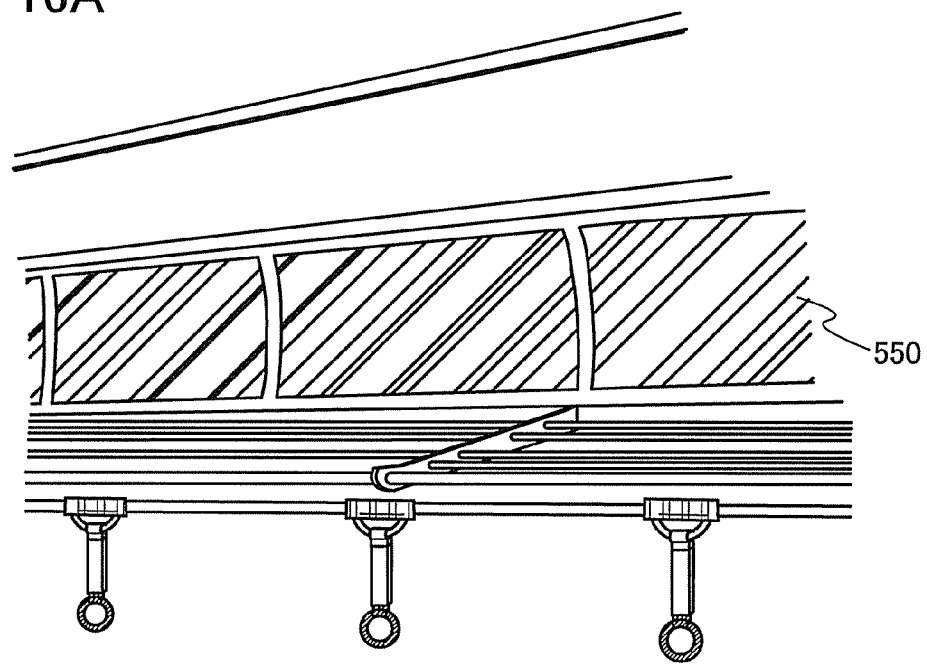
FIGS. 16A and 16B each illustrate an example of an electronic device according to one embodiment of the present invention.

FIG. 16A illustrates an advertisement panel 550 in a vehicle such as a train. Further, the advertisement panel 550 in a vehicle may transmit and receive data wirelessly. When a photoelectric conversion element according to one embodiment of the present invention is used for the advertisement panel 550 in a vehicle, the advertisement panel 550 in a vehicle can withstand severe usage environment.

Figure 16B:
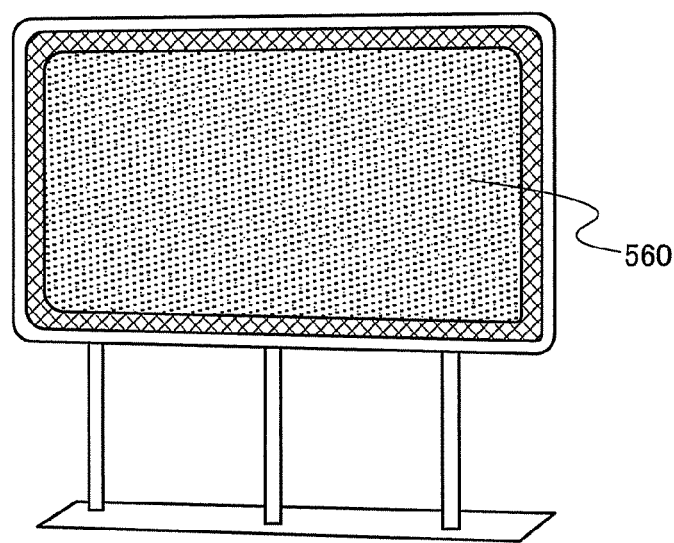

FIG. 16B illustrates an electronic signboard 560 formed using electronic paper. The electronic signboard may transmit and receive data wirelessly. When a photoelectric conversion element according to one embodiment of the present invention is used for the electronic signboard 560, the electronic signboard 560 can withstand severe usage environment. In an electronic signboard such as that in FIG. 16B, light with high intensity is emitted from a backlight; therefore, particularly in the case of such an electronic signboard, it is possible to make good use of merits of the photoelectric conversion element according to one embodiment of the present invention, which enables suppression of photodegradation.

As described above, the photoelectric conversion element described in Embodiment 1 and the display device described in Embodiment 3 can be used in electronic devices.

This application is based on Japanese Patent Application serial no. 2010-139737 filed with the Japan Patent Office on Jun. 18, 2010, the entire contents of which are hereby incorporated by reference.

What is claimed is:

1. A photoelectric conversion element comprising:
a first conductive layer over a substrate;
a first insulating layer over the first conductive layer;
a first semiconductor layer over the first insulating layer;
a second semiconductor layer over the first semiconductor layer;
an impurity semiconductor layer over the second semiconductor layer;
a second conductive layer over the impurity semiconductor layer;
a second insulating layer over the second conductive layer; and
a third conductive layer over the second insulating layer,
wherein the third conductive layer includes a light-transmitting conductive material,
wherein the second insulating layer includes a first opening,
wherein the first semiconductor layer and the third conductive layer are connected to each other through the first opening, and
wherein the first opening is surrounded by the second conductive layer, wherein the second insulating layer includes a second opening, and wherein the third conductive layer and a first wiring formed of a same material as the first conductive layer are connected to each other through the second opening.

2. The photoelectric conversion element according to claim 1,
wherein a resistor is provided between the first wiring and a second wiring formed of the first conductive layer.

3. The photoelectric conversion element according to claim 2,
wherein the resistor is a transistor, and
wherein the photoelectric conversion element has the same layered structure as the transistor.

4. The photoelectric conversion element according to claim 2,
wherein the resistor includes the third conductive layer, and
wherein the resistor has higher electric resistivity than the first wiring and the second wiring.

5. The photoelectric conversion element according to claim 1,
wherein a potential of a second wiring formed of the first conductive layer is higher than a potential of the first wiring.

6. The photoelectric conversion element according to claim 2,
a potential difference between a potential of the first wiring and a potential of a second wiring is kept constant.

7. The photoelectric conversion element according to claim 1,
wherein the second insulating layer includes a second opening, and
wherein the third conductive layer and a wiring formed of a same material as the second conductive layer are connected to each other through the second opening.

8. The photoelectric conversion element according to claim 1,
wherein the first semiconductor layer is a crystalline semiconductor layer.

9. The photoelectric conversion element according to claim 1,
wherein the first semiconductor layer and the second semiconductor layer include a microcrystalline semiconductor region and a region including an amorphous semiconductor, and
wherein the microcrystalline semiconductor region extends in a conical or pyramidal shape from the first semiconductor layer toward the second semiconductor layer.

10. A display device comprising the photoelectric conversion element according to claim 1 and a pixel transistor over the substrate,
wherein the pixel transistor has a same layered structure as the photoelectric conversion element, and
wherein the pixel transistor includes a source and a drain one of which is connected to a pixel electrode.

11. A photoelectric conversion element comprising:
a first conductive layer over a substrate;
a first insulating layer over the first conductive layer;
a first semiconductor layer over the first insulating layer;
second semiconductor layers over the first semiconductor layer;
impurity semiconductor layers over the second semiconductor layers;
second conductive layers over the impurity semiconductor layers;
a second insulating layer over the second conductive layers; and
a third conductive layer over the second insulating layer,
wherein the third conductive layer includes a light-transmitting conductive material,
wherein the second insulating layer includes a first opening,
wherein the first semiconductor layer and the third conductive layer are connected to each other through the first opening, and
wherein the first opening is sandwiched between the second conductive layers, wherein the second insulating layer includes a second opening, and wherein the third conductive layer and a wiring formed of a same material as the first conductive layer are connected to each other through the second opening.

12. The photoelectric conversion element according to claim 11,
wherein the first semiconductor layer is a crystalline semiconductor layer.

13. The photoelectric conversion element according to claim 11,
wherein the first semiconductor layer and the second semiconductor layers include a microcrystalline semiconductor region and a region including an amorphous semiconductor, and
wherein the microcrystalline semiconductor region extends in a conical or pyramidal shape from the first semiconductor layer toward the second semiconductor layers.

14. A display device comprising the photoelectric conversion element according to claim 11 and a pixel transistor over the substrate,
wherein the pixel transistor has a same layered structure as the photoelectric conversion element, and
wherein the pixel transistor includes a source and a drain one of which is connected to a pixel electrode.

15. A photoelectric conversion element comprising:
a first conductive layer over a substrate;
a first insulating layer over the first conductive layer;
a first semiconductor layer over the first insulating layer, comprising:
a first region;
a second region; and
a third region between the first region and the second region;
a second semiconductor layer over the first region;
a third semiconductor layer over the second region;
a first impurity semiconductor layer over the second semiconductor layer;
a second impurity semiconductor layer over the third semiconductor layer;
a second conductive layer over the first impurity semiconductor layer;
a third conductive layer over the second impurity semiconductor layer;
a second insulating layer over the second conductive layer and the third conductive layer; and
a fourth conductive layer over the second insulating layer,
wherein the fourth conductive layer includes a light-transmitting conductive material,
wherein the second insulating layer include a first opening, and
wherein the third region and the fourth conductive layer are connected to each other through the first opening, wherein the second insulating layer includes a second opening, and wherein the third conductive layer and a first wiring formed of a same material as the first conductive layer are connected to each other through the second opening.

16. The photoelectric conversion element according to claim 15,
wherein the second insulating layer includes a second opening, and
wherein the third conductive layer and a wiring formed of a same material as the second conductive layer are connected to each other through the second opening.

17. The photoelectric conversion element according to claim 15,
wherein the first semiconductor layer is a crystalline semiconductor layer.

18. The photoelectric conversion element according to claim 15,
wherein the first semiconductor layer and the second semiconductor layer include a microcrystalline semiconductor region and a region including an amorphous semiconductor, and
wherein the microcrystalline semiconductor region extends in a conical or pyramidal shape from the first semiconductor layer toward the second semiconductor layer.

19. A display device comprising the photoelectric conversion element according to claim 15 and a pixel transistor over the substrate,
wherein the pixel transistor has a same layered structure as the photoelectric conversion element, and
wherein the pixel transistor includes a source and a drain one of which is connected to a pixel electrode.

* * * * *

UNITED STATES PATENT AND TRADEMARK OFFICE
CERTIFICATE OF CORRECTION

PATENT NO. : 8,487,306 B2
APPLICATION NO. : 13/163166
DATED : July 16, 2013
INVENTOR(S) : Koji Dairiki, Hidekazu Miyairi and Tsudoi Nagi Page 1 of 1

It is certified that error appears in the above-identified patent and that said Letters Patent is hereby corrected as shown below:

In the Specification:

Column 4, line 29, Change "to the thy etching," to --to the dry etching,--.

Signed and Sealed this
Twelfth Day of November, 2013

Teresa Stanek Rea
*Deputy Director of the United States Patent and Trademark Office*